United States Patent
Osame et al.

(10) Patent No.: US 7,323,924 B2
(45) Date of Patent: Jan. 29, 2008

(54) LEVEL SHIFTER CIRCUIT

(75) Inventors: Mitsuaki Osame, Kanagawa (JP); Hiromi Yanai, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 11/379,138

(22) Filed: Apr. 18, 2006

(65) Prior Publication Data

US 2006/0232319 A1    Oct. 19, 2006

(30) Foreign Application Priority Data

Apr. 19, 2005    (JP) .............................. 2005-121753

(51) Int. Cl.
*H03L 5/00*    (2006.01)
(52) U.S. Cl. .................. 327/333; 327/306; 326/62; 326/68; 326/80
(58) Field of Classification Search ................ 327/108, 327/306, 333; 326/62, 63, 68, 80, 81
See application file for complete search history.

(56) References Cited

U.S. PATENT DOCUMENTS

| | | | |
|---|---|---|---|
| 6,292,183 B1 * | 9/2001 | Yamazaki et al. ......... 345/211 |
| 6,384,808 B2 | 5/2002 | Azami |
| 6,567,067 B2 | 5/2003 | Azami |
| 6,700,429 B2 * | 3/2004 | Kanno et al. ............... 327/333 |
| 6,777,981 B2 * | 8/2004 | Kobayashi .................. 326/81 |
| 6,842,043 B1 * | 1/2005 | Nguyen et al. ............. 326/68 |
| 2005/0052214 A1 * | 3/2005 | Sushihara ................... 327/333 |

* cited by examiner

*Primary Examiner*—Linh My Nguyen
*Assistant Examiner*—Patrick O'Neill
(74) *Attorney, Agent, or Firm*—Fish & Richardson P.C.

(57) ABSTRACT

A low-power consumption level shifter circuit is provided by preventing a through current which is generated when a level of a signal is changed. In order to prevent a through current which flows when a level of a signal of the input is changed, the p-channel TFTs are controlled so that the p-channel TFTs and the n-channel TFT or the p-channel TFTs and the n-channel TFT are not turned on at once. A high level signal is inputted to the gate of the n-channel TFT, and at the moment when the n-channel TFT is turned on, the p-channel TFT is turned off. Similarly, at the moment when the n-channel TFT is turned on, the p-channel TFT is turned off. The p-channel TFTs and the n-channel TFT, or the p-channel TFTs and the n-channel TFT are not turned on at once, thereby a path in which the through current flows is cut off.

11 Claims, 12 Drawing Sheets

Prior Art

FIG9.A
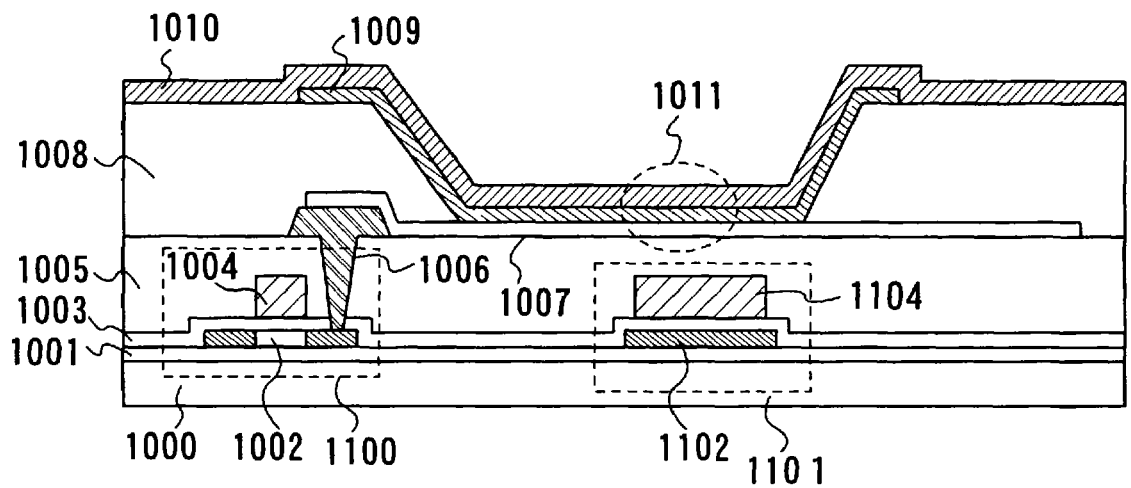
FIG9.B
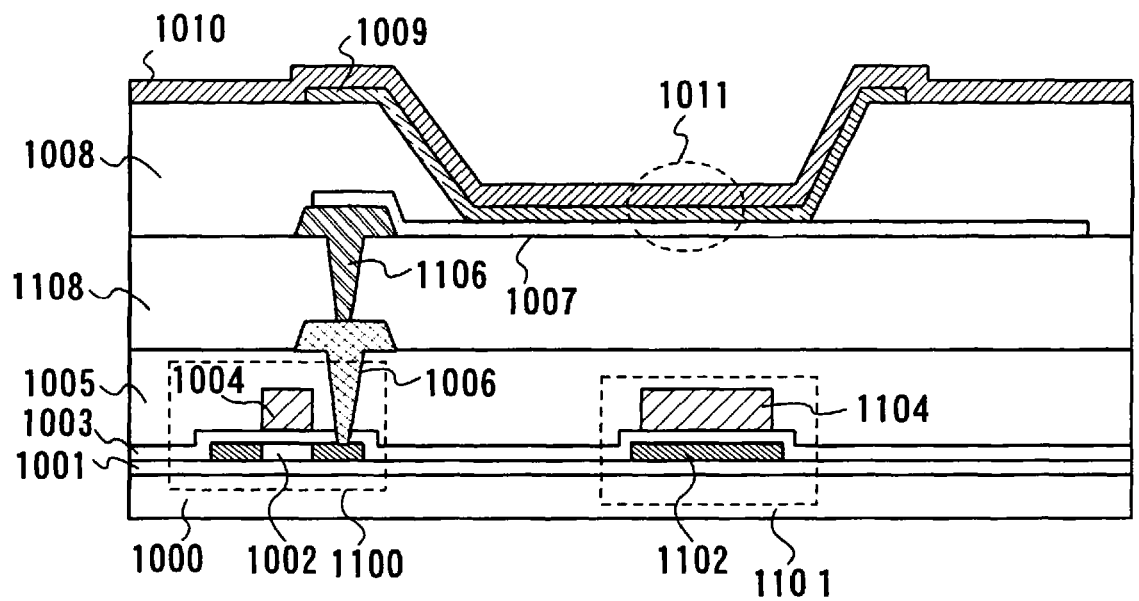

LEVEL SHIFTER CIRCUIT

BACKGROUND OF THE INVENTION

1. Field of the Invention

The invention relates to a level shifter circuit which converts the amplitude of a signal. Further, the invention relates to a display device using a level shifter circuit and a driver circuit thereof.

2. Description of the Related Art

Since it is preferable that a mobile phone and a portable device such as a PDA (Personal Digital Assistant) be easy to carry and be used for a long time with limited power, power consumption has been required to be reduced. Therefore, there are quite a few integrated circuits (LSIs) for forming such a device as described above, which drive at a power source voltage of approximately 1.8 to 5 V. On the other hand, in a display device such as an LCD or an electroluminescence (EL) display, which is driven by these LSIs, there is at least a circuit which operates at a high voltage of 10 to 20 V as an example among internal driver circuits. For such a driver circuit, a level shifter circuit is used, which converts the amplitude of a signal when a control signal to be outputted from the low power source voltage circuit interacts with a high power source voltage circuit (see Patent Document 1).

[Patent Document 1] Japanese Patent Laid-Open No. 2001-257581

As a conventional level shifter circuit, a circuit configuration shown in FIG. 4 is given as an example. Hereinafter, the configuration of a level shifter circuit shown in FIG. 4 is described. A signal which changes between a high level as a VDD potential and a low level as a GND potential (hereinafter referred to as a VDD power source potential system) is inputted to an input 401. On the other hand, an inverted signal of the signal inputted to the input 401 is inputted to an input 405. The inputs 401 and 405 become inputs of the level shifter circuit.

As the signal inputted to the input 405, a signal generated by inverting the signal inputted to the input 401 with an inverter or the like may be used.

Identical power source inputting portions which are provided with a power source which is not shown, and supplied with a potential from the same power source are denoted by the same reference numerals. A power source inputting portion 402 supplied with a VDH potential from a first power source (not shown) is connected to sources of p-channel transistors 408 and 411. Further, a drain of the p-channel transistor 408 is connected to a source of a p-channel transistor 407, a drain of the p-channel transistor 407 is connected to a drain of an n-channel transistor 406, and a source of the n-channel transistor 406 is connected to a power source inputting portion 412 supplied with a GND potential from a second power source (not shown). Further, a drain of the p-channel transistor 411 is connected to a source of a p-channel transistor 410, a drain of the p-channel transistor 410 is connected to a drain of an n-channel transistor 409, and a source of the n-channel transistor 409 is connected to the power source inputting portion 412.

A signal which changes between a high level as a VDH potential and a low level as a GND potential (hereinafter referred to as a VDH power source system) is outputted from an output 403. An inverted signal of the signal outputted from the output 403, which is a VDH power source system signal, is outputted from an output 404. The outputs 403 and 404 become outputs of the level shifter circuit. As described above, the level shifter circuit shown in FIG. 4 converts the VDD power source system signal to the VDH power source system signal and outputs it.

Note that the level shifter circuit includes a power source which supplies 3 kinds of potentials, that is, a VDH potential, a VDD potential, and a GND potential. Description is made on operation of the level shifter circuit shown in FIG. 4 under the condition that a VDH potential is 15 V, a VDD potential is 5V, and a GND potential is 0 V. In addition, a threshold voltage of a p-channel transistor is set to −1 V and a threshold voltage of an n-channel transistor is set to 1V.

In a first period, when the signal inputted to the input 401 is at a high level, the VDD potential (5 V) is inputted to each gate of the n-channel transistor 406 and the p-channel transistor 407. At this time, the n-channel transistor 406 is turned on; thereby the GND potential (0 V) is inputted to a gate of the p-channel transistor 411 and the p-channel transistor 411 is turned on. The GND potential (0 V) is outputted from the output 403.

On the other hand, since an inverted signal of the signal inputted to the input 401, which is a low level, is inputted to the input 405, the GND potential (0 V) is inputted to each gate of the n-channel transistor 409 and the p-channel transistor 410. At this time, the p-channel transistor 410 is turned on and the p-channel transistor 411 is turned on as described above, thereby the VDH potential (15 V) is inputted to the p-channel transistor 408 and the p-channel transistor 408 is turned off. The VDH potential (15V) is outputted from the output 404.

In a second period subsequent to the first period, the signal inputted to the input 401 changes from a high level to a low level. The transitional period includes at least a period in which a potential of the input 401 is around intermediate between a high level and a low level. In view of the condition of each threshold of the n-channel transistor and the p-channel transistor, in the case where the signal inputted to the input 401 changes, if the potential is between 1 V and 4 V, each of the n-channel transistor 406 and the p-channel transistor 407 is at over the threshold and turned on. On the other hand, at the input 405 side, a similar phenomenon occurs, that is, each of the n-channel transistor 409 and the p-channel transistor 410 is turned on. At this time, the p-channel transistor 411 is turned on in the first period and the gate potential is to be increased. On the contrary, the p-channel transistor 408 is turned off in the first period, and the gate potential is to be decreased. Accordingly, at least a period in which each of the n-channel transistor 409, the p-channel transistor 410, and the p-channel transistor 411 is turned on is generated. Therefore, a through current is generated between the VDH potential and the GND potential.

Subsequently, in a third period subsequent to the second period, the signal inputted to the input 401 changes from a low level to a high level. The transitional period includes a period in which each of the n-channel transistor 406, the p-channel transistor 407, and the p-channel transistor 408 is turned on because of the same reason. Therefore, a through current is generated between the VDH potential and the GND potential.

Thus, the conventional level shifter circuit has a problem that a high-voltage VDH power source system through current is generated in a moment in the transitional period in which a level of an input signal changes, which increases power consumption. The amount of the through current which is generated in the transitional period in which a level of the signal changes is smaller than that of a current consumed by a driver circuit. In the case where a plurality of level shifter circuits each having the same structure are provided, however, a total amount of the though current cannot be ignored.

SUMMARY OF THE INVENTION

The invention provides a level shifter circuit having a structure in which the through current can be suppressed to the minimum in the transitional period in which a level of the signal changes in view of the aforementioned problem.

According to the conventional level shifter circuit shown in FIG. 4, the through current is generated, because a period in which all transistors provided in series at the VDH potential and the GND potential are turned on is generated, specifically, a period in which each of the n-channel transistor 406 and the p-channel transistor 407 is turned on while the p-channel transistor 408 is turned on and a period in which each of the n-channel transistor 409 and the p-channel transistor 410 is turned on while the p-channel transistor 411 is turned on are generated.

According to the invention, in the n-channel transistor 406 and the p-channel transistor 407, or the n-channel transistor 409 and the p-channel transistor 410, which are controlled to be turned on/off by the same input signal, when one transistor changes from an off state to an on state, the other transistor is controlled so as to be surely maintained at an off state. That is, a structure is employed, in which the n-channel transistors 406 and 409 are controlled by the signals inputted to the inputs 401 and 405 respectively whereas the p-channel transistors 407 and 410 are controlled by another signal, and the p-channel transistor 407 is turned off before the n-channel transistor 406 changes from an off state to an on state, and the p-channel transistor 410 is turned off before the n-channel transistor 409 changes from an off state to an on state. Accordingly, a level shifter circuit can be operated so as not to generate a period in which the through current is generated between the VDH potential and the GND potential through all periods in which the level shifter circuit is operated by a desired input signal.

As specifically described above, by employing the aforementioned structure for the level shifter circuit of the invention, the through current which is generated at the timing at which the input signal changes can be prevented, which contributes to reduce power consumption.

BRIEF DESCRIPTION OF THE DRAWINGS

FIGS. 9A and 9B are circuit diagrams showing Embodiment 5.

DETAILED DESCRIPTION OF THE INVENTION

Although the invention will be fully described by way of embodiment modes and embodiments with reference to the accompanying drawings, it is to be understood that various changes and modifications will be apparent to those skilled in the art. Therefore, unless such changes and modifications depart from the scope of the invention, they should be construed as being included therein.

Further, in the invention, a connection means an electrical connection. Therefore, in a structure disclosed by the invention, in addition to the predetermined connections, another element which enables an electrical connection (for example, a switch, a transistor, a diode, a capacitor, a resistor, or the like) may be arranged therebetween.

A switch may be any switch such as an electrical switch or a mechanical switch as long as the switch can control current flow. It may be a transistor, a diode, or another logic circuit.

A transistor used for the invention may be a thin film transistor (TFT) using a non-single crystalline semiconductor film represented by amorphous silicon or polycrystalline silicon, a MOS transistor formed by using a semiconductor substrate or an SOI (Silicon on Insulator) substrate, a junction transistor, a bipolar transistor, a transistor using an organic semiconductor or a carbon nanotube, or the like. Furthermore, a substrate on which a transistor is mounted is not limited to a certain type. It may be a single crystalline substrate, an SOI substrate, an insulating substrate formed of quartz, glass, or a resin, and the like.

EMBODIMENT MODE 1

Figure 3A:
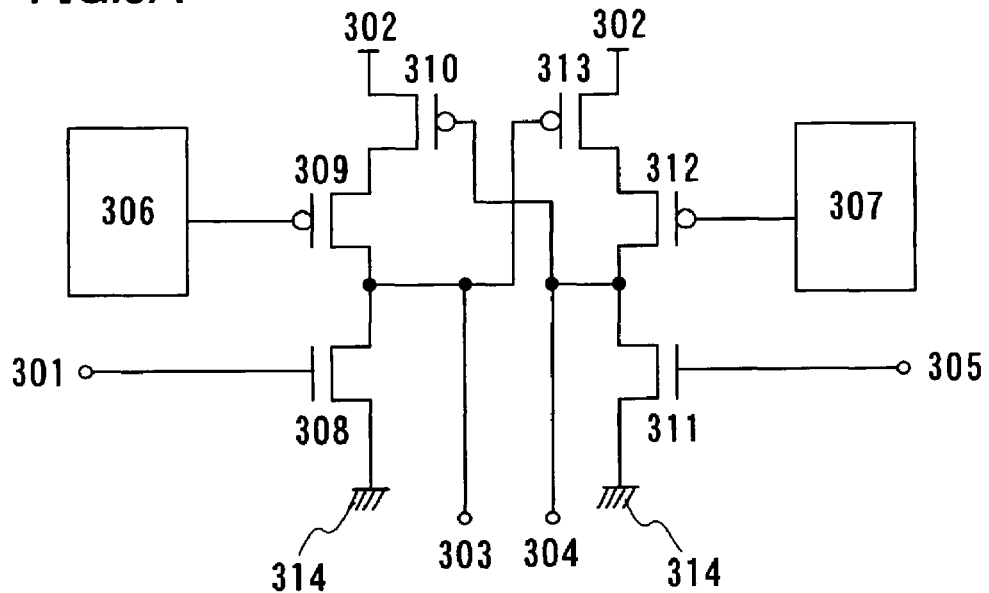
FIGS. 3A and 3B are circuit diagrams showing Embodiment Mode 1.

FIG. 3A shows an embodiment mode of the level shifter circuit of the invention. In the circuit in FIG. 3A, a VDD power source system signal which changes between a high level (for example, 5 V) and a low level (for example, 0 V) is inputted from an input 301 to a gate of an n-channel transistor 308. On the other hand, the inverted signal of the input 301 is inputted from an input 305 to a gate of an n-channel transistor 311. Note that identical power source inputting portions which are provided with a power source which is not shown, and supplied with a potential from the same power source are denoted by the same reference numerals.

A power source inputting portion 302 which is supplied with a VDH potential (for example, 15 V) from the first power source (not shown) is connected to sources of p-channel transistors 310 and 313. Further, a drain of the p-channel transistor 310 is connected to a source of a p-channel transistor 309, a drain of the p-channel transistor 309 is connected to a drain of the n-channel transistor 308, and a source of the n-channel transistor 308 is connected to a power source inputting portion 314 which is supplied with a GND potential (for example, 0 V) from the second power source (not shown). Further, a drain of the p-channel transistor 313 is connected to a source of a p-channel transistor 312, a drain of the p-channel transistor 312 is connected to a drain of the n-channel transistor 311, and a source of the n-channel transistor 311 is connected to the power source inputting portion 314 which is supplied with a GND potential from the second power source.

An inputting unit 306 outputs a signal inputted to a gate of the p-channel transistor 309. As a signal to be outputted by the inputting unit 306, a signal capable of surely selecting to turn on/off the p-channel transistor 309 is required. For example, a VDH power source system signal which changes between a high level (for example, 15V) and a low level (for example, 0 V) can be cited.

An inputting unit 307 outputs a signal inputted to a gate of the p-channel transistor 312. As a signal to be outputted by the inputting unit 307, a signal capable of surely selecting to turn on/off the p-channel transistor 312 is required similarly to the signal to be outputted by the inputting unit 306.

Outputs 303 and 304 are outputs of the level shifter circuit, and each of them outputs a VDH power source system signal. An inverted signal of a signal outputted from the output 303 is outputted from the output 304. Thus, the level shifter circuit shown in FIG. 3A converts a VDD power source system signal into a VDH power source system signal and outputs it.

Figure 3B:
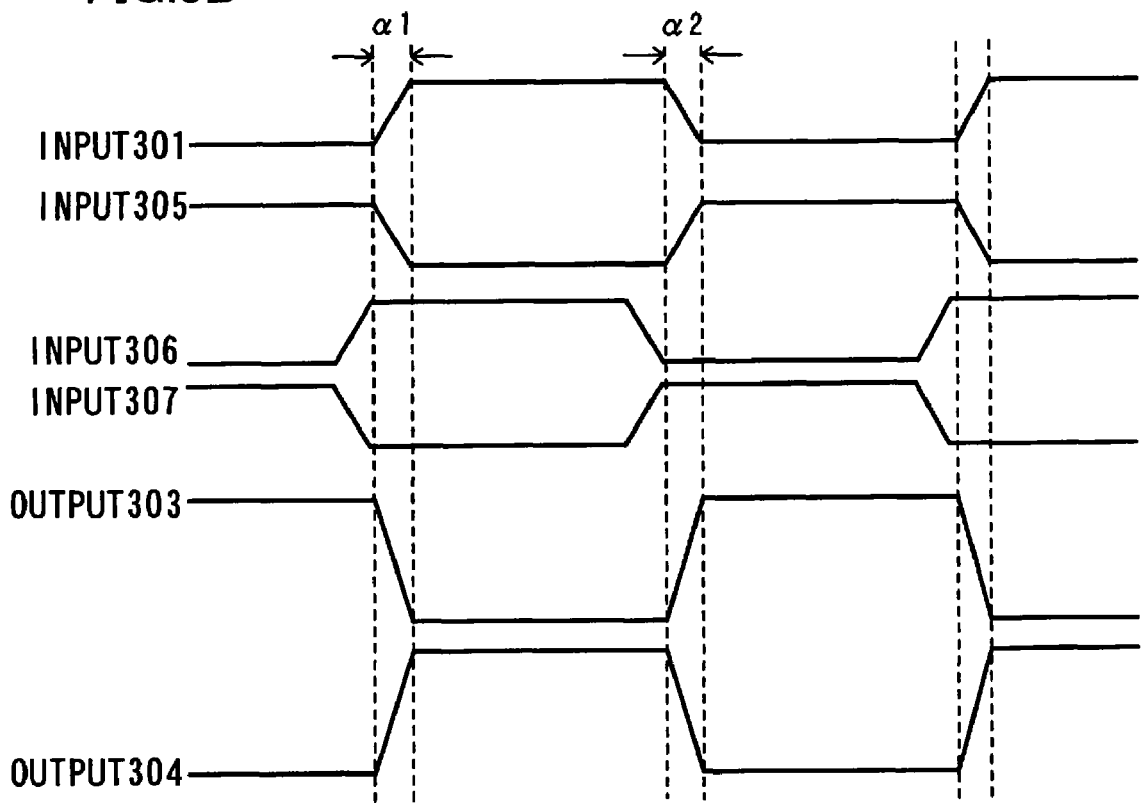

Description is made on operation of the level shifter circuit shown in FIG. 3A with reference to a timing chart shown in FIG. 3B. When a signal inputted to the input 301 is a high level (5 V), the n-channel transistor 308 is turned on. At this time, a signal outputted by the inputting unit 306 is a high level (15 V), and the p-channel transistor 309 remains off. Accordingly, a low-level signal (0 V) is inputted to a gate of the p-channel transistor 313 so as to turn on the p-channel transistor 313, and a GND potential (0 V) is outputted from the output 303. On the other hand, a signal inputted to the input 305 is a low level (0 V), and the n-channel transistor 311 is turned off. At this time, a signal outputted by the inputting unit 307 is a low level (0 V), and the p-channel transistor 312 remains on. As described above, the p-channel transistor 313 is turned on. Therefore, a high level signal is inputted to a gate of the p-channel transistor 310 so as to turn off the p-channel transistor 310, and a VDH potential (15 V) is outputted from the output 304.

When a signal inputted to the input 301 is a low level (0 V), a signal inputted to the input 305 is a high level (5 V). By the same operation as described above, a VDH potential (15 V) is outputted from the output 303, and a GND potential (0 V) is outputted from the output 304.

Here, a case where a signal inputted to the input 301 changes from a low level to a high level (a period referred to as α1 in FIG. 3B) is considered with reference to FIG. 3B. In the conventional level shifter circuit shown in FIG. 4, the through current is generated in this transitional period. On the other hand, in the level shifter circuit of the invention shown in FIG. 3A, the inputting unit 306 inputs a high level signal so as to turn off the p-channel transistor 309 before the signal inputted to the input 301 changes from a low level to a high level and a gate potential of the n-channel transistor 308 is increased to turn on the n-channel transistor 308. That is, in the transitional period in which the signal inputted to the input 301 changes from a low level to a high level, even in the case where the p-channel transistor 310 is turned on, the p-channel transistor 309 is turned off before the n-channel transistor 308 is turned on, thereby a path where the through current is generated can be cut off.

On the other hand, a case where the signal inputted to the input 301 changes from a high level to a low level (a period referred to as α2 in FIG. 3B) is considered. At this time, the inputting unit 307 inputs a high level signal so as to turn off the p-channel transistor 312 before the signal inputted to the input 305 changes from a low level to a high level and a gate potential of the n-channel transistor 311 is increased to turn on the n-channel transistor 311. That is, in the transitional period in which the signal inputted to the input 305 changes from a low level to a high level, even in the case where the p-channel transistor 313 is turned on, the p-channel transistor 312 is turned off before the n-channel transistor 311 is turned on, thereby a path where the through current is generated can be cut off.

Note that the signal inputted to the input 301 and the signal inputted to the input 305 are VDD power source system signals, and one signal is an inverted signal of the other signal. Therefore, one signal may be inverted by using an inverter and used as an input signal inputted to the other input.

Further, signals outputted by the inputting units 306 and 307 are VDH power source system signals. As shown in FIG. 3B, it is acceptable as far as timing at which the signal outputted by the inputting unit 306 changes from a low level to a high level is surely earlier than timing at which the signal inputted to the input 301 changes from a low level to a high level, and timing at which the signal outputted by the inputting unit 307 changes from a low level to a high level is surely earlier than timing at which the signal inputted to the input 305 changes from a low level to a high level.

According to FIG. 3B, a phase of the signal outputted from the inputting unit 306 precedes the signal inputted to the input 301 by each period shown by α1 and α2. In addition, a VDH power source system signal is given as a preferable example of the signal outputted from the inputting unit 306. Further, an inverted signal of the signal outputted from the inputting unit 306 is given as a preferable example of the signal outputted from the inputting unit 307.

Further, each of the periods shown by α1 and α2 in FIG. 3B is a period at which the output 303 or 304 may be set in a floating state. Therefore, it is preferable that the period be minimized while the n-channel transistor 308 and the p-channel transistor 309 or the n-channel transistor 311 and the p-channel transistor 312 are turned on/off under the above-mentioned condition of the order.

In the invention, each value of a VDD potential, a VDH potential, and a GND potential may be appropriately set in accordance with the capability of the level shifter circuit and the structure of a peripheral driver circuit.

EMBODIMENT MODE 2

Figure 1A:
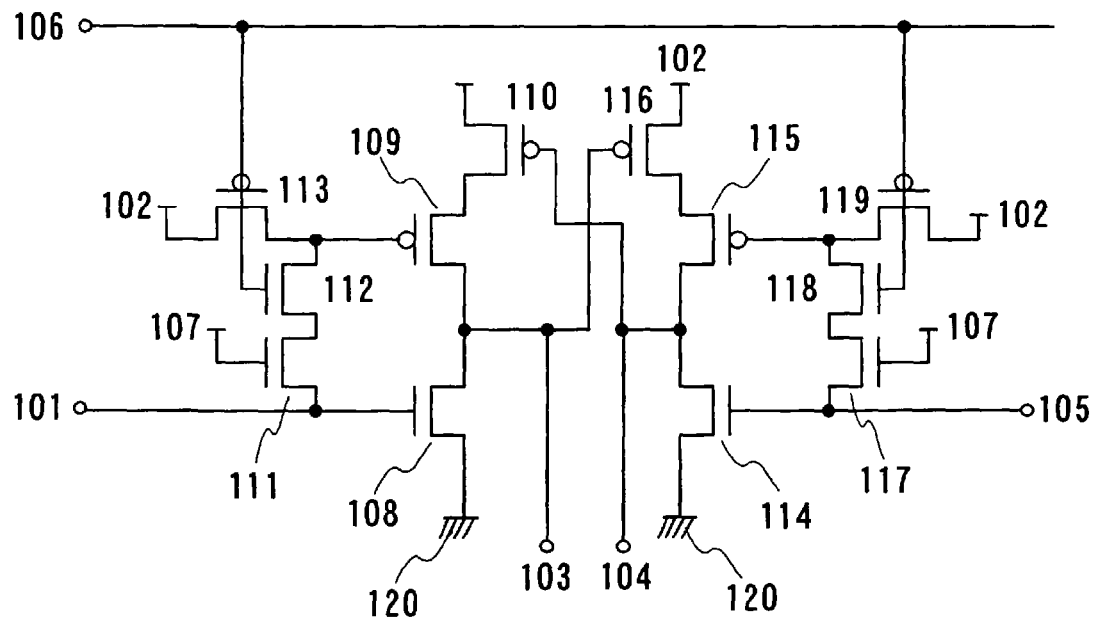
FIGS. 1A and 1B are circuit diagrams showing Embodiment Mode 2.

FIG. 1A shows another embodiment mode of the level shifter circuit of the invention. Note that identical power source inputting portions which are provided with a power source which is not shown, and supplied with a potential from the same power source are denoted by the same reference numerals. In the circuit shown in FIG. 1A, a VDD power source system signal which changes between a high level (for example, 5 V) and a low level (for example, 0 V) is inputted from the input 101 to a gate of an n-channel transistor 108. On the other hand, the inverted signal of the input 101 is inputted from the input 105 to a gate of an n-channel transistor 114.

A VDH power source system signal which changes between a high level (for example, 15 V) and a low level (for example, 0 V), for controlling p-channel transistors 109 and 115 through an n-channel transistor 112 and an p-channel transistor 113, and an n-channel transistor 118 and a p-channel transistor 119 respectively is inputted from an input 106.

Each gate of n-channel transistors 111 and 117 is connected to a power source inputting portion 107 and supplied with a VDD potential (for example, 5 V) from a third power source (not shown).

A power source inputting portion 102 which is supplied with a VDH potential (for example, 15 V) from a first power source (not shown) is connected to sources of p-channel transistors 110 and 116. Further, a drain of the p-channel transistor 110 is connected to a source of the p-channel transistor 109, a drain of the p-channel transistor 109 is connected to a drain of the n-channel transistor 108, and a source of the n-channel transistor 108 is connected to a power source inputting portion 120 which is supplied with a GND potential (for example, 0 V) from a second power source (not shown). Further, a drain of the p-channel transistor 116 is connected to a source of the p-channel transistor 115, a drain of the p-channel transistor 115 is connected to a drain of the n-channel transistor 114, and a source of the n-channel transistor 114 is connected to the power source inputting portion 120 which is supplied with a GND potential from the second power source.

The n-channel transistors 111 and 112 are connected in series. A source of the n-channel transistor 111 is connected to the input 101. A drain of the n-channel transistor 112 is connected to a gate of the p-channel transistor 109. A gate of the n-channel transistor 112 is connected to the input 106. A source of the p-channel transistor 113 is connected to the power source inputting portion 102 which is supplied with the VDH potential from the first power source. A drain of the p-channel transistor 113 is connected to the gate of the p-channel transistor 109. A gate of the p-channel transistor 113 is connected to the input 106.

The n-channel transistors 117 and 118 are connected in series. A source of the n-channel transistor 117 is connected to the input 105. A drain of the n-channel transistor 118 is connected to a gate of the p-channel transistor 115. A gate of the n-channel transistor 118 is connected to the input 106. A source of the p-channel transistor 119 is connected to the power source inputting portion 102 which is supplied with the VDH potential from the first power source. A drain of the p-channel transistor 119 is connected to a gate of the p-channel transistor 115. A gate of the p-channel transistor 119 is connected to the input 106.

A VDH power source system signal is outputted from an output 103. Further, an inverted signal of the signal outputted from the output 103, which is a VDH power source system signal, is outputted from an output 104. The outputs 103 and 104 become outputs of the level shifter circuit. Thus, the level shifter circuit shown in FIG. 1A converts a VDD power source system signal into the VDH power source system signal and outputs it.

Specific description is made on operation of the level shifter circuit shown in FIG. 1A.

When the inputs 101 and 105 are a high level or a low level, the input 106 inputs a high-level signal.

When the input 101 is a high level, the n-channel transistor 108 is turned on, and a GND potential is outputted from the output 103. At the same time, the p-channel transistor 116 is turned on. On the other hand, since the input 105 is a low level at this time, the n-channel transistor 114 is turned off. A high-level signal is inputted to the input 106; thereby each of the p-channel transistors 113 and 119 is turned off. The source potential of the n-channel transistor 117, that is, the input 105 is a low level, and a VDD potential is inputted to the gate of the n-channel transistor 117, thereby the n-channel transistor 117 is turned on. Accordingly, the n-channel transistor 118 is also turned on, and the GND potential is inputted to the gate of the p-channel transistor 115 and the p-channel transistor 115 is turned on. Each of the p-channel transistors 115 and 116 is turned on, thereby the VDH potential is outputted from the output 104.

On the other hand, when the input 101 is a low level, the input 105 which is the inverted signal of the input 101 is a high level, thereby the n-channel transistor 114 is turned on and the GND potential is outputted from the output 104. At the same time, the p-channel transistor 110 is turned on, whereas the n-channel transistor 108 is turned off. A high level signal is inputted to the input 106; thereby each of the p-channel transistors 113 and 119 is turned off. The source potential of the n-channel transistor 111, that is, the input 101 is a low level, and a VDD potential is inputted to the gate of the n-channel transistor 111, thereby the n-channel transistor 111 is turned on. Accordingly, the n-channel transistor 112 is also turned on, and the GND potential is inputted to the gate of the p-channel transistor 109 and the p-channel transistor 109 is turned on. Each of the p-channel transistors 119 and 110 is turned on, thereby the VDH potential is outputted from the output 103.

Figure 1B:
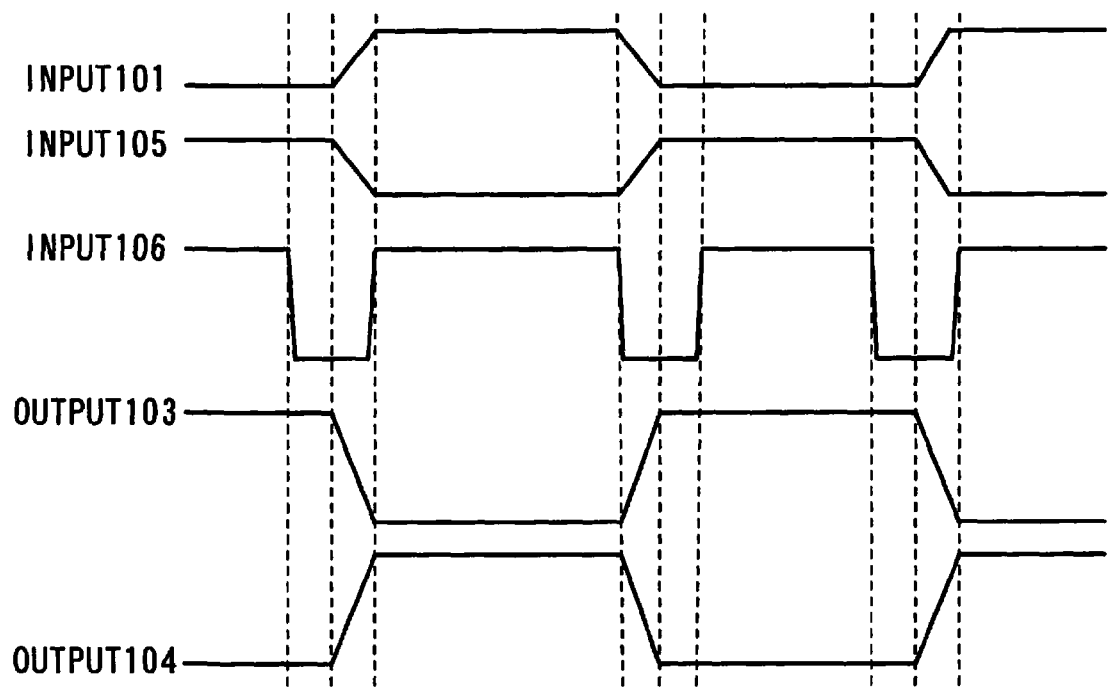

Subsequently, description is made on a period in which a signal inputted to the inputs 101 and 105 changes from a high level to a low level, or from a low level to a high level with reference to FIG. 1B.

In the period including a transitional period in which a signal changes, a signal inputted to the input 106 is a low level. Specifically, the signal inputted to the input 106 before the signal inputted to the inputs 101 and 105 starts to change is a low level, and the signal inputted to the input 106 after the signal inputted to the inputs 101 and 105 completes to change and a high level or a low level is determined is changed to a high level again. By setting the signal inputted to the input 106 to a low level, the n-channel transistors 112 and 118 are turned off regardless of the state of the n-channel transistors 111 and 117, and the p-channel transistors 113 and 119 are turned on. Accordingly, the VDH potential is inputted to each gate of the p-channel transistors 109 and 115, and the p-channel transistors 109 and 115 are turned off.

By this operation, in the n-channel transistor 108, in the transition period in which the signal inputted to the input 101 changes from a low level to a high level, or from a high level to a low level, the p-channel transistor 109 is surely turned off, whereas in the transitional period in which the signal inputted to the input 105 changes from a low level to a high level, or from a high level to a low level, the p-channel transistor 115 is surely turned off. Accordingly, as mentioned above, a path in which the through current is generated can be cut off.

Figure 2:
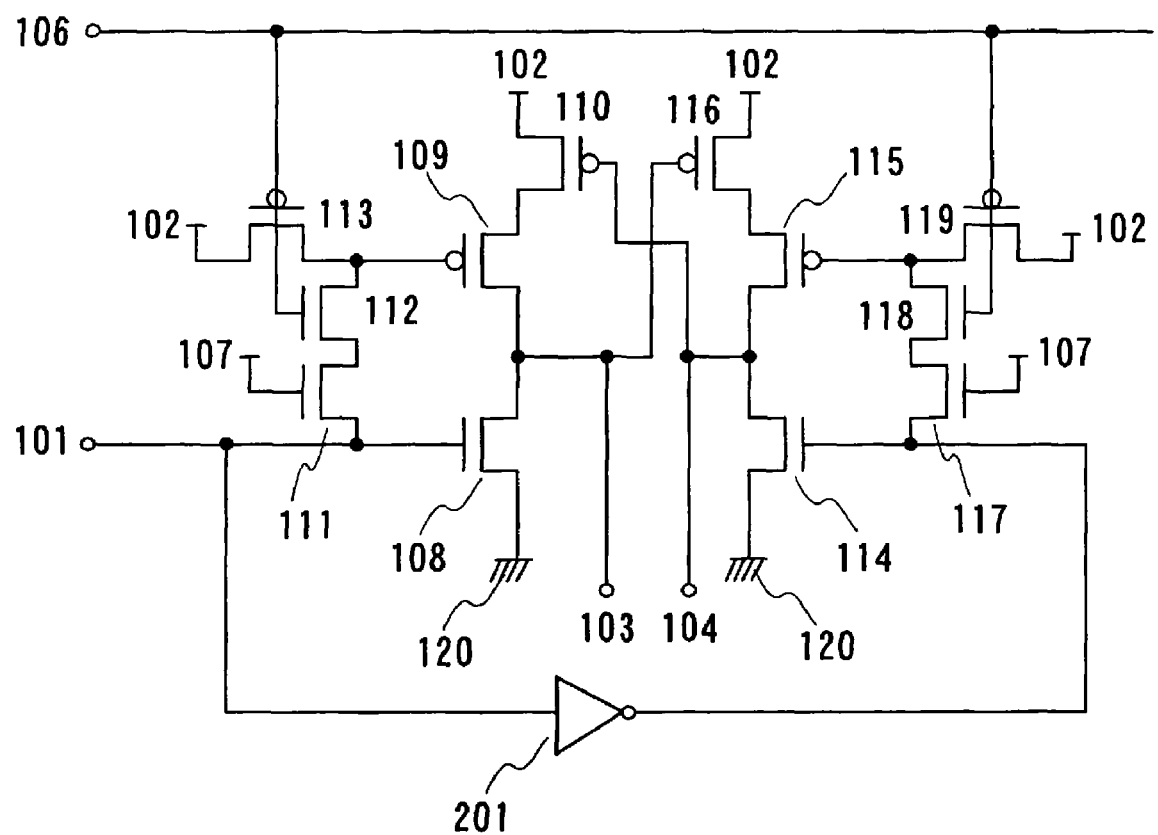
FIG. 2 is a circuit diagram showing Embodiment Mode 2.

Note that one of the inputs 101 and 105 shown in FIG. 1A is the inverted signal of the other signal. Here, as shown in FIG. 2, the signal of the input 101 is inverted by using an inverter 201, and the inverted signal may be supplied to the gate of the n-channel transistor 114.

EMBODIMENT 1

In Embodiment 1, description is made on an example in which a driver circuit for outputting a signal level-shifted by the level shifter circuit of the invention shown in FIG. 1A to a plurality of wires. At this time, a level shifter is required to be provided in each of the plurality of wires. As such a driver circuit, for example, there is a driver circuit for outputting a signal to a wire provided in each column (or each row) of cells arranged in matrix. Specifically, the level shifter circuit of the invention can be applied to a signal line driver circuit for outputting a video signal or the like to a signal line provided in each column of a plurality of pixels arranged in matrix, which forms a display. Further, the level shifter circuit of the invention can be applied to a scan line driver circuit for outputting a selection signal or the like to a scan line provided in each row of the plurality of pixels arranged in matrix, which forms a display.

Here, the level shifter circuit converts a signal level in order to transfer a signal between a VDD power source system low signal level circuit (a circuit which operates by a low voltage power source) and a VDH power source system high signal level circuit (a circuit which operates by a high voltage power source) in the case where both circuits are in the driver circuit. A signal inputted to the input 106 is required to be a VDH power source system signal so that the level shifter circuit shown in FIG. 1A changes the signal level. This is because the VDH potential is supplied from a first power source to the power source inputting portion 102; therefore, when the signal inputted to the input 106 is not the VDH power source system signal, the p-channel transistors 113 and 119 cannot be accurately controlled to be switched between on and off. When the p-channel transistors 113 and 119 cannot be accurately controlled to be switched between on and off, the p-channel transistors 109 and 115 also cannot be accurately controlled to be switched between on and off. Therefore, a level of the signal inputted to the input 106 of the level shifter circuit shown in FIG. 1 is required to be changed from a VDD power source system to a VDH power source system.

Figure 4:
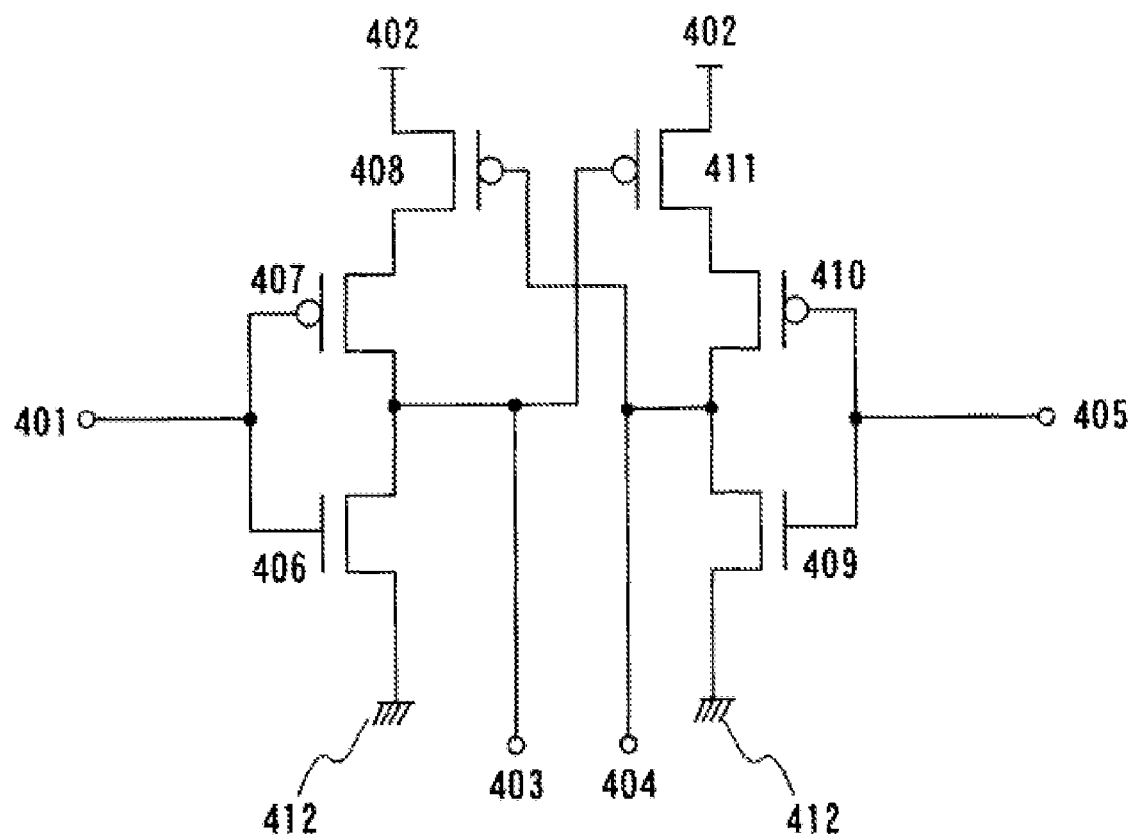
FIG. 4 is a circuit diagram of a conventional level shifter circuit.

According to the level shifter circuit shown in FIG. 1A, an input signal of the input 106 can be generated by using a level shifter circuit similar to the conventional level shifter circuit shown in FIG. 4.

Note that in the case where tens to thousands of level shifter circuits are required to be provided in the driver circuit, the through current can be controlled and power consumption can be reduced by using the level shifter circuit of the invention described as the level shifter circuit with reference to FIG. 1A, compared with the case where the conventional level shifter circuit described with reference to FIG. 4 is used.

In this case, even when only one level shifter circuit similar to the conventional level shifter circuit shown in FIG. 4 is used to generate a large number of input signals of the input 106 of the level shifter circuit shown in FIG. 1A, advantageous effect of the invention can be obtained as well.

In particular, the number of signal lines and scan lines of a display increases in proportion to the number of pixels. Therefore, the invention particularly has effectiveness in the case of a driver circuit in a display which requires a plurality of level shifter circuits corresponding to the plurality of signal lines and scan lines.

Figure 5:
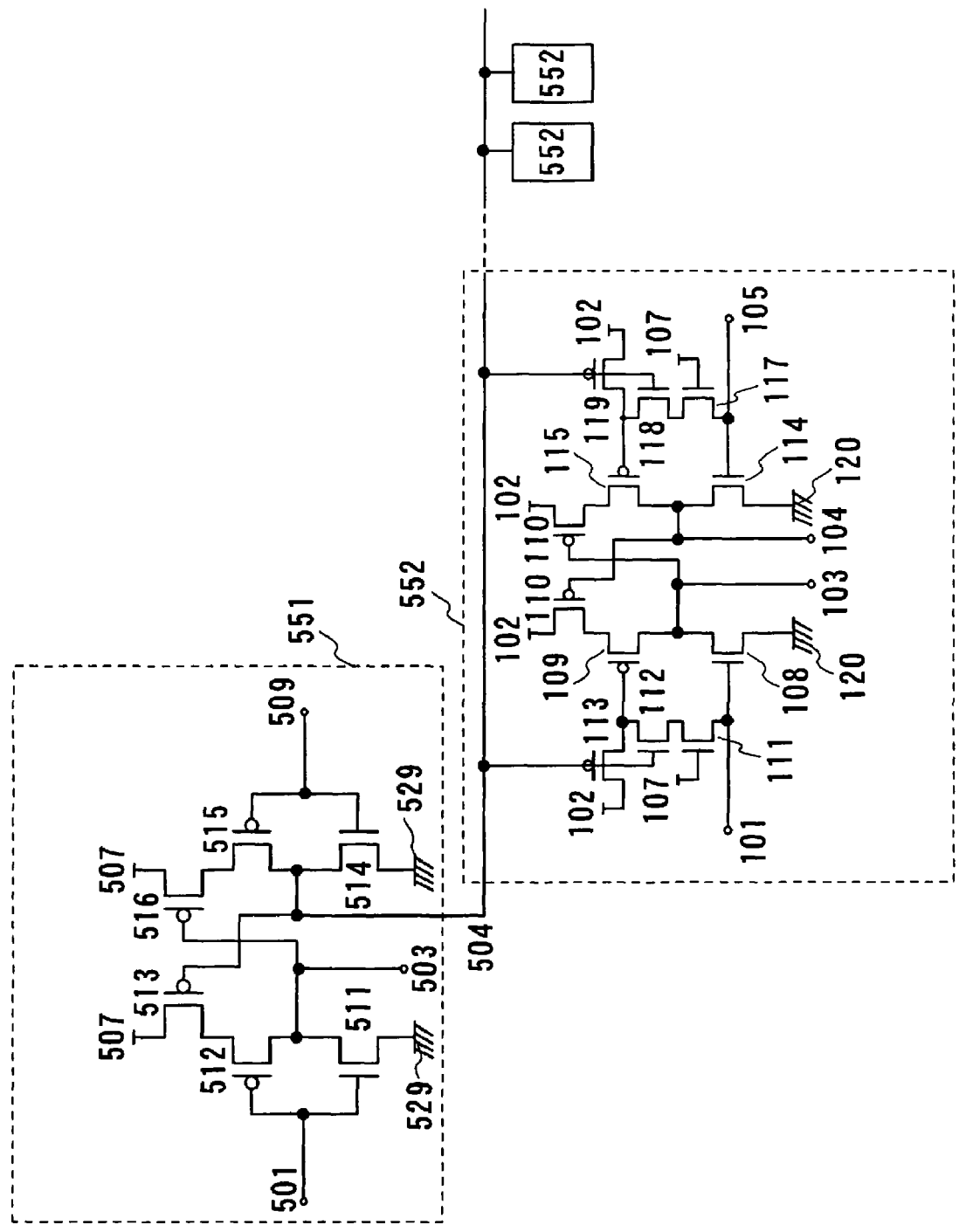
FIG. 5 is a circuit diagram showing Embodiment 1.

FIG. 5 shows an example in which a driver circuit for outputting a level-shifted signal to a plurality of wires.

A driver circuit shown in FIG. 5 includes a first level shifter circuit 551 and a plurality of second level shifter circuits 552. Identical power source inputting portions which are provided with a power source which is not shown, and supplied with a potential from the same power source are denoted by the same reference numerals.

A configuration of the first level shifter circuit 551 is the same as that of the level shifter circuit shown in FIG. 4. In the first level shifter circuit 551, a VDD power source system signal is inputted from an input 501. The input 501 is an input of the first level shifter circuit 551. The VDD power source system signal is inputted to each gate of a p-channel transistor 512 and an n-channel transistor 511. A VDH potential is supplied from a first power source (not shown) to a power source inputting portion 507. The power source inputting portion 507 is connected to each source of p-channel transistors 513 and 516.

An inverted signal of the signal inputted to the input 501 is inputted to an input 509 and supplied to each gate of a p-channel transistor 515 and an n-channel transistor 514. The input 509 may be generated by inverting the signal inputted to the input 501 with an inverter.

Further, a drain of the p-channel transistor 513 is connected to a source of the p-channel transistor 512. A drain of the p-channel transistor 512 is connected to a drain of the n-channel transistor 511. A source of the n-channel transistor 511 is connected to a power source inputting portion 529 supplied with a GND potential from a second power source (not shown). Further, a drain of the p-channel transistor 516 is connected to a source of the p-channel transistor 515. A drain of the p-channel transistor 515 is connected to a drain of the n-channel transistor 514. A source of the n-channel transistor 514 is connected to the power source inputting portion 529 supplied with the GND potential from the second power source (not shown).

A VDH power source system signal is outputted from an output 503. Further, a VDH power source system signal inverted by the output 503 is outputted from an output 504. The outputs 503 and 504 are outputs of the first level shifter circuit 551.

Each of the plurality of second level shifter circuits 552 is connected to the output 504 which is one of the outputs of the first level shifter circuit 551. Identical portions are denoted by the same reference numerals in the plurality of second level shifter circuits 552 in FIG. 4 and the level shifter circuit in FIG. 1. The input 106 is used in common in the plurality of second level shifter circuits 552, and connected to the output 504 which is one of the outputs of the first level shifter circuit 551. Note that the output 503 may be used instead of the output 504. A VDD power source system signal is inputted to each of the inputs 101 of the plurality of second level shifter circuits 552.

Description is made on a timing of operating the first level shifter circuit 551 and the plurality of second level shifter circuits 552.

When a signal of the output 504 of the first level shifter circuit 551 is a low level, the plurality of second level shifter circuits 552 cannot change a level. Therefore, the output 103 is a low level regardless of a signal inputted to the input 101.

A little after the output 504 is changed from a low level to a high level, an input signal of the input 101 of the second level shifter circuit 552 is changed to a high level. At this time, p-channel transistors 109 and 115 of the second level shifter circuit 552 are turned off, thereby a path of the through current is cut off and the through current does not flow. Thus, a GND potential (0 V) is outputted from each of the outputs 103 of the plurality of second level shifter circuits 552, and a VDH potential is outputted from the output 104. Further, when the input 101 is a low level, the VDH potential is outputted from the output 103, and the GND potential (0 V) is outputted from the output 104.

By the aforementioned configuration, a signal outputted from each of the outputs 103 of the plurality of second level shifter circuit 552 or a signal outputted from each of the outputs 104 can be outputted to a plurality of wires. Therefore, the driver circuit shown in FIG. 5 can convert an inputted VDD power source system signal into a VDH power source signal and output it to a plurality of wires. According to the driver circuit shown in FIG. 5, the through current of the plurality of level shifter circuits included in the driver circuit can be suppressed, and power consumption of the driver circuit can be reduced.

This embodiment can be implemented by freely combining with embodiment modes.

EMBODIMENT 2

Figure 6A:
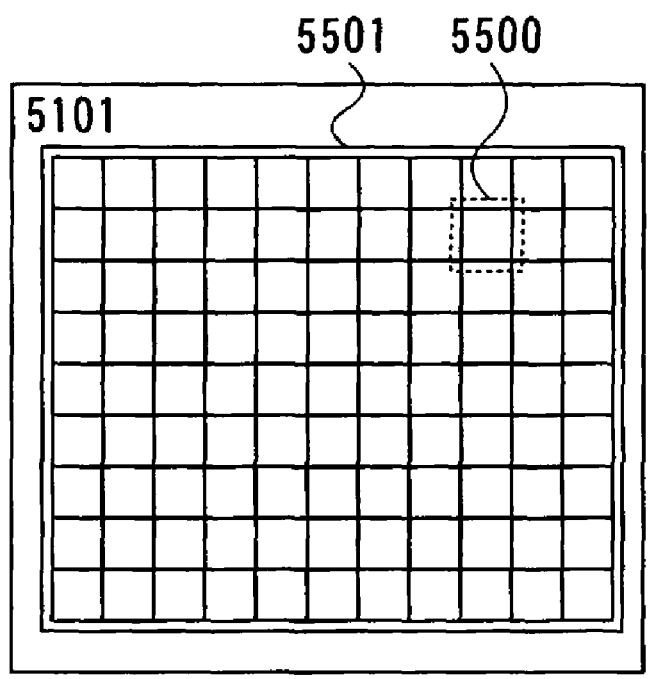
FIGS. 6A and 6B are circuit diagrams showing Embodiment 2.

The level shifter circuit of the invention can be used as a driver circuit of a display. The display includes a plurality of pixels. In this embodiment, description is made on an example of a panel over which the plurality of pixels are formed with reference to FIGS. 6A and 6B. In FIG. 6A, a panel 5101 includes a pixel portion 5501 formed of a plurality of pixels 5500 which are arranged in matrix. The pixel portion 5501 can have an active matrix system structure in which a switching element such as a thin film transistor is arranged in each of the pixels 5500. As a display element of each of the pixels 5500, a light-emitting element such as an electroluminescent element may be provided, or a liquid crystal element may be provided.

Figure 6B:
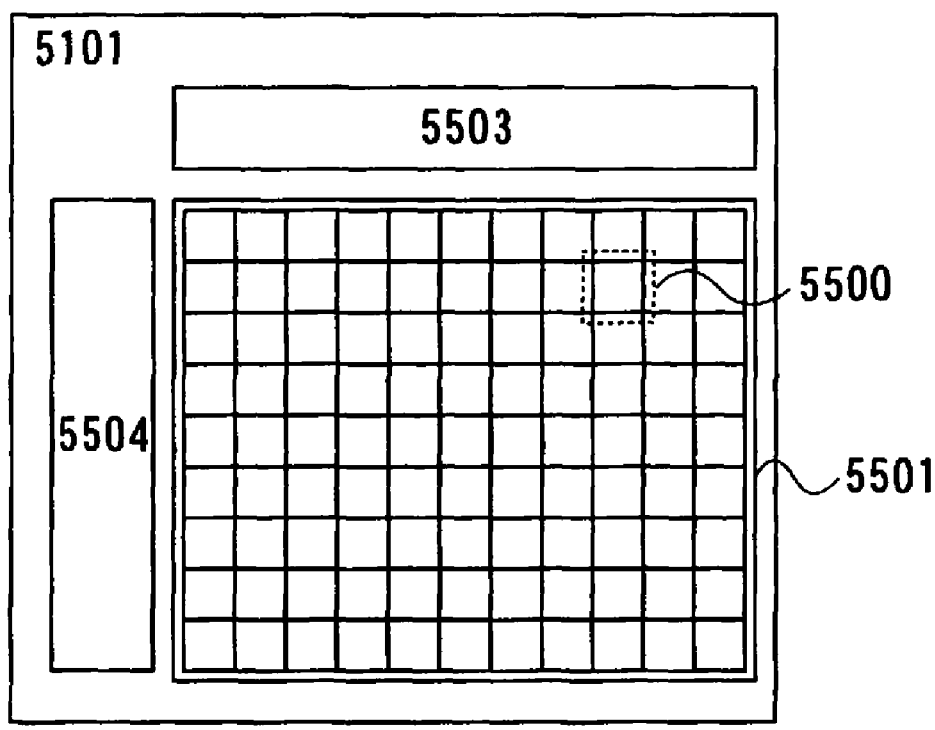

Note that, as shown in FIG. 6B, a driver circuit for driving the pixel portion 5501 may be provided over the same substrate as a substrate of the pixel portion 5501. Identical portions are denoted by the same reference numerals in FIGS. 6A and 6B. In FIG. 6B, a signal line driver circuit 5503 and a scan line driver circuit 5504 are shown as driver circuits. Note that the driver circuits are not limited to them. In addition to the signal line driver circuit 5503 and the scan line driver circuit 5504, the other driver circuit may also be provided. The driver circuits may be formed over the other substrate and mounted on the substrate of the pixel portion 5501. Further, the driver circuits may be formed by using a thin film transistor formed in the same process as the thin film transistor included in each of the pixels 5500 over the same substrate as the substrate of the pixel portion 5501. A channel forming region of the thin film transistor may be formed of polycrystalline semiconductor or amorphous semiconductor.

This embodiment can be implemented by freely combining with embodiment modes and Embodiment 1.

EMBODIMENT 3

Figure 7A:
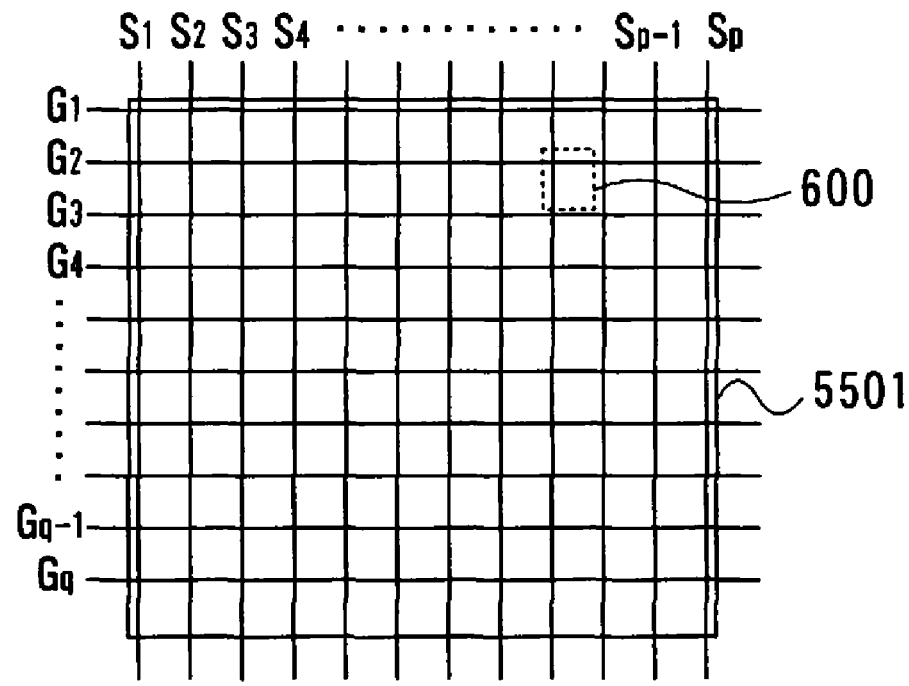
FIGS. 7A and 7B are circuit diagrams showing Embodiment 3.

FIG. 7A shows an example of a structure of the pixel portion 5501 (hereinafter, referred to as a first pixel structure) shown in FIGS. 6A and 6B. The pixel portion 5501 includes a plurality of signal lines S1 to Sp (p is a natural number), a plurality of scan lines G1 to Gq (q is a natural number) provided so as to intersect with the plurality of signal lines S1 to Sp, and pixels 600 provided at each intersection of the signal lines S1 to Sp and the scan lines G1 to Gq.

Figure 7B:
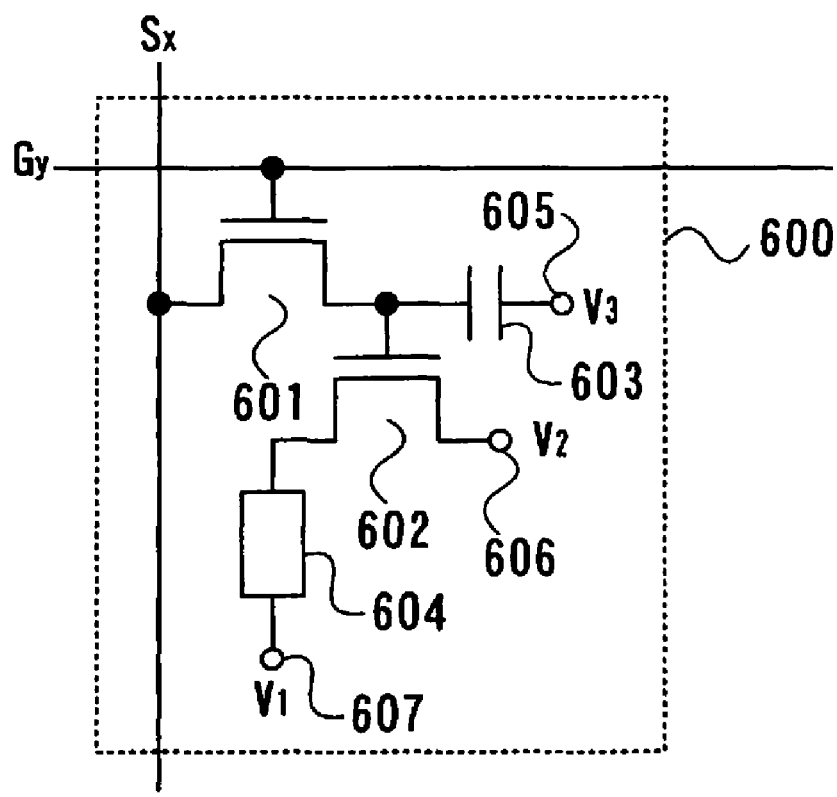

FIG. 7B shows a structure of the pixel 600 in FIG. 7A. FIG. 7B shows the pixel 600 formed at the intersection of one of the plurality of signal lines S1 to Sp, Sx (x is a natural number equal to or less than p) and one of the plurality of scan lines G1 to Gq, Gy (y is a natural number equal to or less than q). The pixel 600 includes a first transistor 601, a second transistor 602, a capacitor 603, and a light-emitting element 604. Note that, in this embodiment mode, description is made on an example in which an element which includes a pair of electrodes and emits light by a current flowing between the pair of electrodes is used as a light-emitting element 604. Note that as the capacitor 603, parasitic capacitance of the second transistor 602 or the like may be positively used. Each of the first transistor 601 and the second transistor 602 may be an n-channel transistor or a p-channel transistor. A thin film transistor can be used as a transistor which forms the pixel 600.

A gate of the first transistor 601 is connected to the signal line Sx. One of a source and a drain of the first transistor 601 is connected to the scan line Gy, and the other is connected to one electrode of each of the second transistor 602 and the capacitor 603. The other electrode of the capacitor 603 is connected to a terminal 605 supplied with a potential V3. One of a source and a drain of the second transistor 602 is connected to one electrode of the light-emitting element 604, and the other is connected to a terminal 606 supplied with a potential V2. The other electrode of the light-emitting element 604 is connected to a terminal 607 supplied with a potential V1.

Description is made on a displaying method of the pixel portion 5501 shown in FIGS. 7A and 7B.

An image signal is inputted to each of the plurality of signal lines S1 to Sp while one of the plurality of scan lines G1 to Gq is selected. Thus, the image signal is inputted to pixels in one row of the pixel portion 5501. The plurality of scan lines G1 to Gq are sequentially selected and similar operation is carried out, thereby the image signal is inputted to each of the pixels 600 of the pixel portion 5501.

Description is made on the operation of the pixel 600 in which one of the plurality of scan lines G1 to Gq, Gy is selected and the image signal is inputted from one of the plurality of signal lines S1 to Sp, Sx. When the scan line Gy is selected, the first transistor 601 is turned on. An on state of a transistor means that a source and a drain are in a conduction state. An off state of a transistor means that a source and a drain are not in a conduction state. When the first transistor 601 is turned on, the image signal inputted to the signal line Sx is inputted to the gate of the second transistor 602 through the first transistor 601. The second transistor 602 is selected to be turned on/off in accordance with the inputted image signal. When the second transistor 602 is selected to be turned on, a drain current of the second transistor 602 flows to the light-emitting element 604 and the light-emitting element 604 emits light.

The potentials V2 and V3 are held so that a potential difference is always constant when the second transistor 602 is turned on. The potentials V2 and V3 may be the same potential. In this case, the terminals 605 and 606 may be connected to the same wire. The potentials V1 and V2 are set so as to have a predetermined potential difference when the light-emitting element 604 is selected to emit light. Thus, a current flows to the light-emitting element 604, thereby the light-emitting element 604 emits light.

A plurality of subframe periods are provided in one frame period, and light emission/non-light emission of each of a plurality of pixels may be selected in each of the plurality of subframe periods as mentioned above. Thus, a gray scale may be expressed by controlling a period in which an emission is selected per frame period. Such a gray scale displaying method is referred to as a time division gray scale method.

This embodiment can be implemented by freely combining with embodiment modes and Embodiments 1 and 2.

EMBODIMENT 4

Figure 8A:
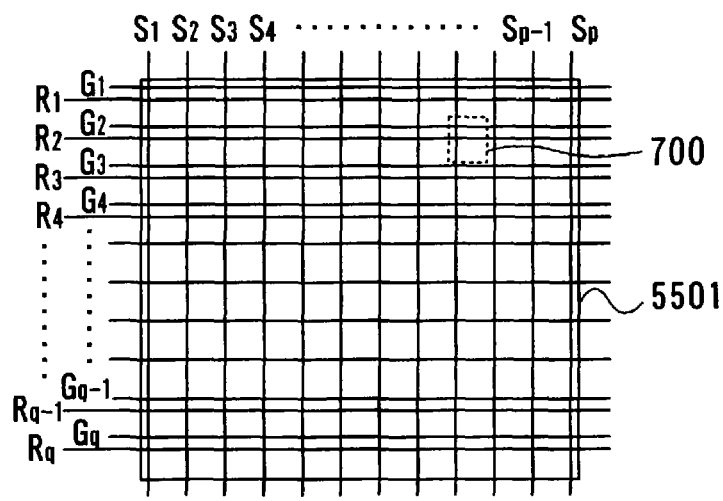
FIGS. 8A to 8C are circuit diagrams showing Embodiment 4.

FIG. 8A shows an example of a structure of the pixel portion 5501 shown in FIGS. 6A and 6B. FIG. 8A shows an example different from the first pixel structure described in Embodiment 3 (hereinafter, referred to as a second pixel structure). The pixel portion 5501 includes the plurality of first signal lines S1 to Sp (p is a natural number), the plurality of scan lines G1 to Gq (q is a natural number) provided so as to intersect with the plurality of signal lines S1 to Sp, a plurality of scan lines R1 to Rq, and pixels 700 provided at each intersection of the signal lines S1 to Sp and the scan lines G1 to Gq.

Figure 8B:
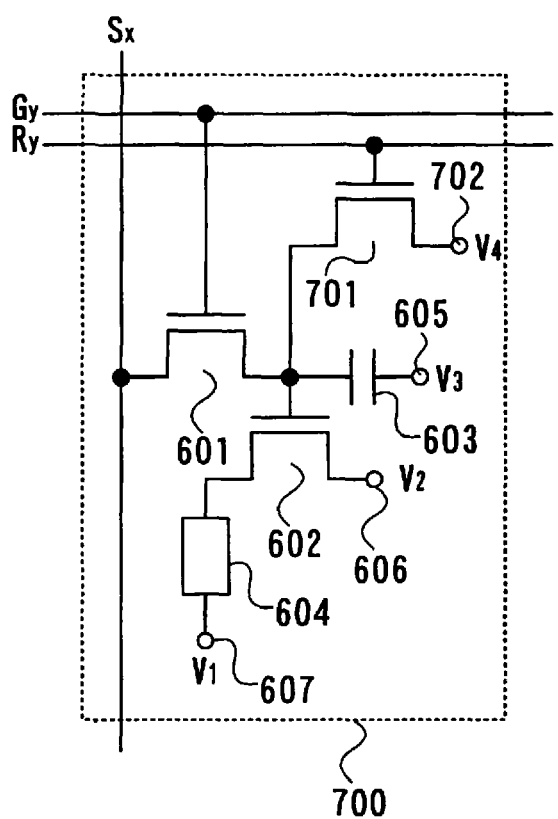

FIG. 8B shows a structure of the pixel 700 in FIG. 8A. FIG. 8B shows the pixel 700 formed at the intersection of one of the plurality of signal lines S1 to Sp, Sx (x is a natural number equal to or less than p), one of the plurality of scan lines G1 to Gq, Gy (y is a natural number equal to or less than q), and one of the plurality of scan lines R1 to Rq, Ry. Note that identical portions are denoted by the same reference numerals in FIG. 8B and FIG. 7B and description on such portions is omitted. The pixel 700 in FIG. 8B is different in that the pixel 700 includes a third transistor 701 from the pixel 600 shown in FIG. 7B. The third transistor 701 may be an n-channel transistor or a p-channel transistor. A thin film transistor can be used to form the pixel 700.

A gate of the third transistor 701 is connected to the scan line Ry. One of a source and a drain of the third transistor 701 is connected to the gate of the second transistor 602 and one electrode of the capacitor 603, and the other is connected to a terminal 702 supplied with a potential V4.

Description is made on a displaying method of the pixel portion 5501 shown in FIGS. 8A and 8B.

A method by which the light-emitting element 604 emits light is the same as that described in Embodiment 3. It is characteristic that a pixel having the structure shown in FIGS. 8A and 8B includes the scan line Ry and the third transistor 701, thereby the light-emitting element 604 of the pixel 700 can be set to emit no light regardless of an image signal inputted from the signal line Sx. A light-emitting period in which the light-emitting element 604 of the pixel 700 emits light can be set by a signal inputted to the scan line Ry. Thus, each of the scan lines G1 to Gq is sequentially selected, and a light-emitting period shorter than the period in which all of the scan lines G1 to Gq are selected can be set. Accordingly, in the case of displaying by the time division gray scale method, a subframe period can be set to be short. Therefore, high gray scales can be expressed.

The potential V4 may be set so that the second transistor 602 is turned off when the third transistor 701 is turned on. For example, the potential V4 can be set so as to be the same as the potential V3 when the third transistor 701 is turned on. By setting the potentials V3 and V4 to be the same, an electron stored in the capacitor 603 can be discharged and the second transistor 602 can be turned off while setting a voltage between the source and the gate of the second transistor 602 to 0 V. Note that in the case of setting the potentials V3 and V4 to be the same, the terminals 605 and 702 may be connected to the same wire.

Note that the third transistor 701 is not limited to an arrangement shown in FIG. 8B. For example, the second transistor 602 and the third transistor 701 may be arranged in series. According to this structure, by turning off the third transistor 701 by a signal inputted to the scan line Ry, a current flowing to the light-emitting element 604 can be cut off, and the light-emitting element 604 can be set to emit no light.

Figure 8C:
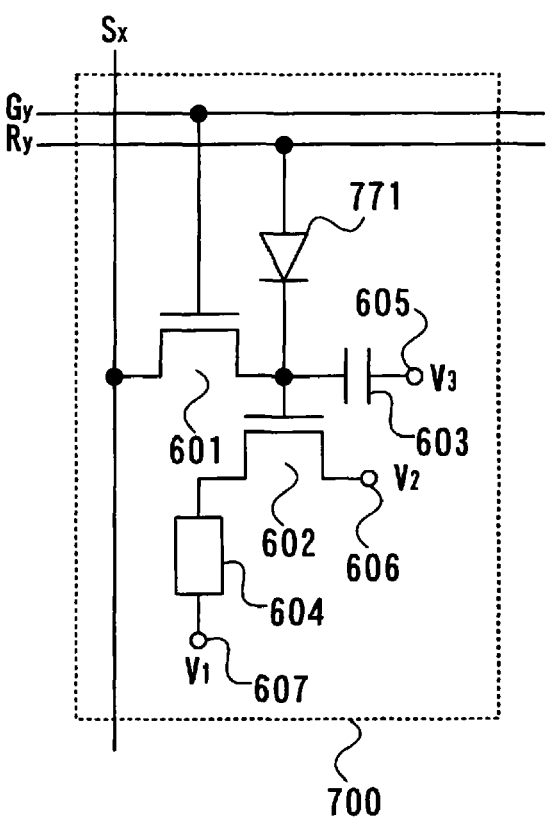

A diode may also be used instead of the third transistor 701 shown in FIG. 8B. FIG. 8C shows a pixel structure in the case where a diode is used instead of the third transistor 701. Note that identical portions are denoted by the same reference numerals in FIGS. 8C and 8B. One electrode of a diode 771 is connected to the scan line Ry, and the other electrode is connected to the gate of the second transistor 602 and one electrode of the capacitor 603.

The diode 771 applies a current from one electrode to the other electrode. The second transistor 602 is a p-channel transistor. By increasing a potential of one electrode of the diode 771, a potential of the gate of the second transistor 602 can be increased, and the second transistor 602 can be turned off.

Although FIG. 8C shows a structure of the diode 771, in which a current is applied from one electrode connected to the scan line Ry to the other electrode connected to the gate of the second transistor 602 and the second transistor 602 is a p-channel transistor, it is not limited to this. The diode 771 may have a structure in which a current is applied from the other electrode connected to the gate of the second transistor 602 to the one electrode connected to the scan line Ry and the second transistor 602 is an n-channel transistor. In this case, by decreasing a potential of one electrode of the diode 771, a potential of the gate of the second transistor 602 is decreased, thereby the second transistor 602 can be turned off.

As the diode 771, a diode-connected transistor may be used. The diode-connected transistor means a transistor to which a drain and a gate are connected. It may be a p-channel transistor or an n-channel transistor.

This embodiment can be implemented by freely combining with embodiment modes and Embodiments 1 to 3.

EMBODIMENT 5

In this embodiment mode, description is made on an example in which a pixel is actually manufactured. FIGS. 9A and 9B are cross sectional views of a pixel in the panel described in Embodiments 3 and 4. They show an example in which a TFT is used as a switching element arranged in the pixel, and a light-emitting element is used as a display medium arranged in the pixel.

In FIGS. 9A and 9B, a reference numeral 1000 denotes a substrate, 1001 denotes a base film, each of 1002 and 1102 denotes a semiconductor layer, 1003 denotes a first insulating film, 1004 denotes a gate electrode, 1104 denotes an electrode, 1005 denotes a second insulating film, 1006 denotes an electrode, 1007 denotes a first electrode, 1008 denotes a third insulating film, 1009 denotes a light-emitting layer, 1010 denotes a second electrode, 1100 denotes a TFT, 1011 denotes a light-emitting element, and 1101 denotes a capacitor. In FIGS. 9A and 9B, the TFT 1100 and the capacitor 1101 are shown as representations of an element forming a pixel. A structure of FIG. 9A is described.

The substrate 1000 can be a glass substrate such as a barium borosilicate glass substrate and an alumino borosilicate glass substrate, a quartz substrate, a ceramic substrate, or the like. Instead, the substrate 1000 may be a metal substrate containing stainless steel or a semiconductor substrate each having a surface over which an insulating film is formed. Alternatively, the substrate 1000 may be formed of a flexible synthetic resin such as plastics. The surface of the substrate 1000 may be planarized in advance by polishing such as CMP.

The base film 1001 can be an insulating film such as silicon oxide, silicon nitride, or silicon nitride oxide. The base film 1001 can prevent an alkaline earth metal or an alkali metal such as Na included in the substrate 1000 from diffusing into a semiconductor layer 1002 and from causing an adverse effect on the characteristic of the TFT 1100. Although in FIG. 9, the base film 1001 is formed of a single layer, it may be formed of stacked layers of 2 or more films. Note that in the case where diffusion of impurities is not a big problem like in the case of using a quartz substrate, for example, the base film 1001 is not always required to be provided.

As the semiconductor layer 1002 and the semiconductor layer 1102, a crystalline semiconductor film and an amorphous semiconductor film may be used. A crystalline semiconductor film can be obtained by crystallizing an amorphous semiconductor film. As a method of crystallization, laser crystallization, thermal crystallization using RTA or an annealing furnace, thermal crystallization using a metal element for promoting crystallization, or the like may be used. The semiconductor layer 1002 includes a channel forming region and a pair of impurity regions to which an impurity element imparting conductivity is added. Note that another impurity region to which an impurity element is added at a low concentration may be provided between the channel forming region and the pair of impurity regions. Accordingly, the whole semiconductor layer 1102 can have a structure to which an impurity element imparting conductivity is added.

The first insulating film 1003 can be formed of a single layer or stacked layers of a plurality of films by using silicon oxide, silicon nitride, silicon nitride oxide, or the like.

The gate electrode 1004 and the electrode 1104 are formed of a single layer or stacked layers of elements selected from Ta, W, Ti, Mo, Al, Cu, Cr, and Nd or an alloy or a compound containing such elements.

The TFT 1100 includes the semiconductor layer 1002, the gate electrode 1004, and the first insulating film 1003 between the semiconductor layer 1002 and the gate electrode 1004. Although in FIGS. 9A and 9B, only the TFT 1100 connected to the first electrode 1007 of the light-emitting element 1011 is shown as a TFT constituting a pixel, a pixel may include a plurality of TFTs. Further, although in this embodiment, the TFT 1100 is shown as a top gate transistor, it may also be a bottom gate transistor having a gate electrode below the semiconductor layer, or a dual gate transistor having gate electrodes above and below the semiconductor layer.

The capacitor 1101 includes the first insulating film 1003 as a dielectric, and the semiconductor layer 1102 and the electrode 1104 as a pair of electrodes that faces each other with the first insulating film 1003 interposed therebetween. FIGS. 9A and 9B show an example in which one of the pair of electrodes of the capacitor included in a pixel is the semiconductor layer 1102 formed at the same time as the semiconductor layer 1002 of the TFT 1100, and the other electrode is the electrode 1104 formed at the same time as the gate electrode 1004 of the TFT 1100. However, the invention is not limited to this.

The second insulating film 1005 can be formed of a single layer or stacked layers of an inorganic insulating film or an organic insulating film. As an inorganic insulating film, a silicon oxide film formed by CVD, a silicon oxide film applied by SOG (Spin On Glass), or the like can be used. As an organic insulating film, a film of polyimide, polyamide, BCB (benzocyclobutene), acrylic, a positive photosensitive organic resin, a negative photosensitive organic resin, or the like can be used.

Further, as the second insulating film 1005, a material having a skeleton of a bond of silicon (Si) and oxygen (O) may be used. As a substituent of this material, an organic group containing at least hydrogen (for example, alkyl group or aromatic hydrocarbon) is used. Alternatively, a fluoro group, or both an organic group containing at least hydrogen and a fluoro group may be used as a substituent.

The electrode 1006 is formed of a single layer or stacked layers of an element selected from Al, Ni, C, W, Mo, Ti, Pt, Cu, Ta, Au, and Mn, or an alloy containing such elements.

One or both of the first electrode 1007 and the second electrode 1010 can be light-transmissive electrodes. As a light-transmissive electrode, indium oxide containing tungsten oxide (IWO), indium zinc oxide containing tungsten oxide (IWZO), indium oxide containing titanium oxide (ITiO), indium tin oxide containing titanium oxide (ITTiO), or the like may be used. Needless to say, indium tin oxide (ITO), indium zinc oxide (IZO), indium tin oxide to which silicon oxide is added (ITSO), or the like may also be used.

The other of the first electrode 1007 and the second electrode 1010 may be formed of a non-light transmissive material. For example, an alkali metal such as Li and Cs, an alkaline earth metal such as Mg, Ca, and Sr, an alloy containing such metals (Mg:Ag, Al:Li, Mg:In, or the like), a compound of such metals (calcium fluoride or calcium nitride), or a rare earth metal such as Yb and Er can be used.

The third insulating film 1008 can be formed using the same material as the second insulating film 1005. The third insulating film 1008 is formed on the periphery of the first electrode 1007 so as to cover an end portion of the first electrode 1007, and has a function of separating the light-emitting layer 1009 in an adjacent pixel.

The light-emitting layer 1009 is formed of a single layer or stacked layers. The light-emitting layer 1009 is preferably formed of a plurality of layers which has a different function such as a hole injecting/transporting layer, a light-emitting layer, and an electron injecting/transporting layer. Note that a boundary between layers is not always required to be clear, and there is a case where materials constituting adjacent layers are mixed with each other so that an interface is unclear.

A hole injecting/transporting layer is preferably formed of a compound material including an organic compound material with a hole transporting property and an inorganic compound material with an electron accepting property from the organic compound material. This structure generates a lot of hole carriers in an organic compound, which originally has almost no inherent carriers, to provide an excellent hole injecting/transporting property. Accordingly, a driving voltage can be lower than a conventional driving voltage. Further, since the hole injecting/transporting layer can be made thick without raising a driving voltage, short circuit of the light-emitting element due to dust and the like can be reduced.

As an organic compound with a hole transporting layer, 4,4',4"-tris[N-(3-methylphenyl)-N-phenylamino]-triphenylamine (abbreviated as MTDATA), 1,3,5-tris[N,N-di(m-tolyl) amimo]benzene (abbreviated as m-MTDAB), N,N'-diphenyl-N, N'-bis(3-methylphenyl)-1,1'-biphenyl-4,4'-diamine (abbreviated as TPD), 4,4'-bis[N-(1-naphthyl)-N-phenylamino]biphenyl (abbreviated as NPB) or the like is given as an example. However, it is not limited to the exa As an inorganic compound material with an electron accepting property, titanium oxide, zirconium oxide, vanadium oxide, molybdenum oxide, tungsten oxide, rhenium oxide, ruthenium oxide, and zinc oxide, or the like is given as an example. In particular, vanadium oxide, molybdenum oxide, tungsten oxide, and rhenium oxide are preferred since these oxides can be used easily for vacuum deposition.

An electron injecting/transporting layer is formed using an organic compound material with an electron transporting property. Specifically, tris (8-quinolinolato) aluminum (abbreviated as $Alq_3$), tris (4-methyl-8-quinolinolato) aluminum (abbreviated as $Almq_3$), or the like is given as an example. However, the organic compound material with an electron transporting property is not limited to the example.

As a light-emitting layer, the following compound can be given as an example: 9,10-di (2-naphthyl) anthracene (abbreviated as DNA), 9,10-di (2-naphthyl)-2-tert-butylanthracene (abbreviated as t-BuDNA), 4,4'-bis(2,2-diphenylvinyl)biphenyl (abbreviated as DPVBi), coumarin 30, coumarin 6, coumarin 545, coumarin 545T, perylene, rubrene, periflanthene, 2,5,8,11-tetra(tert-butyl)perylene (abbreviated as TBP), 9,10-diphenylanthracene (abbreviated as DPA), 5,12-diphenyltetracene, 4-(dicyanomethylene)-2-methyl-[p-(dimethylamino)styryl]-4H-pyran (abbreviated as DCM1), 4-(dicyanomethylene)-2-methyl-6-[2-(julolidine-9-yl)ethenyl]-4H-pyran (abbreviated as DCM2), and 4-(dicyanomethylene)-2,6-bis[p-(dimethylamino)styryl]-4H-pyran (abbreviated as BisDCM), or the like. In addition, compounds capable of producing phosphorescence such as bis [2-(4',6'-difluorophenyl) pyridinato-$N,C^{2'}$]iridium(picolinate) (abbreviated as FIrpic), bis {2-[3',5'-bis(trifluoromethyl)phenyl]pyridinato-$N,C^{2'}$}iridium(picolinate) (abbreviated as Ir(CF$_3$ppy)$_2$(pic)), tris(2-phenylpyridinato-$N,C^{2'}$) iridium (abbreviated as Ir(ppy)$_3$), bis(2-phenylpyridinato-N, $C^{2'}$)iridium (acetylacetonate) (abbreviated as Ir(ppy)$_2$ (acac)), bis[2-(2'-thienyl)pyridinato-$N,C^{3'}$]iridium (acetylacetonate) (abbreviated as Ir(thp)$_2$(acac)), bis(2-phenylquinolinato-$N,C^{2'}$)iridium(acetylacetonate) (abbreviated as Ir(pq)$_2$(acac)), or bis[2-(2'-benzothienyl)pyridinato-$N,C^{3'}$]iridium(acetylacetonate) (abbreviated as Ir(btp)$_2$(acac)) can also be used.

Besides that, as a high molecular weight electroluminescent materials that can be used to form the light-emitting layer, a polyparaphenylene vinylene based material, a polyparaphenylene based material, a polythiophene based material, or a polyfluorene based material can be given as an example.

Whatever the case, the structure of the light emitting layer can be varied. Therefore, instead of providing a specified hole or electron injecting/transporting layer or light emitting layer, modifications of the structure such as providing an electrode layer in order to be used for the hole or electron injecting/transporting layer or the light emitting layer, or providing a dispersed light emitting material can be allowed as far as an object as the light-emitting element can be achieved.

The light-emitting element 1011 is formed of the light-emitting layer 1009, and the first electrode 1007 and the second electrode 1010 which interpose the light-emitting layer 1009 therebetween. One of the first electrode 1007 and the second electrode 1010 corresponds to an anode, and the other corresponds to a cathode. When a forward bias voltage higher than a threshold voltage is applied between the anode and the cathode, a current flows from the anode to the cathode, and the light-emitting element 1011 emits light.

Description is made on a structure of FIG. 9B. Note that identical portions are denoted by the same reference numeral in FIGS. 9A and 9B, and the description is omitted.

FIG. 9B shows a structure in which an insulating film 1108 is sandwiched between the second insulating film 1005 and the third insulating film 1008 in FIG. 9A. The electrode 1006 and the first electrode 1007 are connected through the electrode 1106 in a contact hole formed in the insulating film 1108.

The insulating film 1108 can have the same structure as the second insulating film 1005. The electrode 1106 can have the same structure as the electrode 1006.

This embodiment can be implemented by freely combining with embodiment modes and Embodiments 1 to 4 of the invention.

EMBODIMENT 6

Figure 10A:
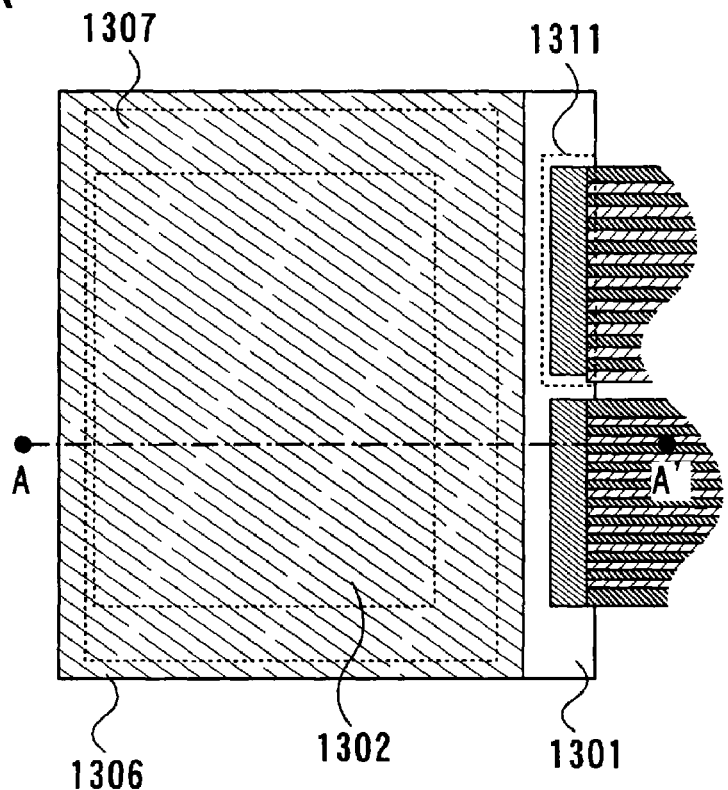
FIGS. 10A to 10C are circuit diagrams showing Embodiment 6.
Figure 10B:
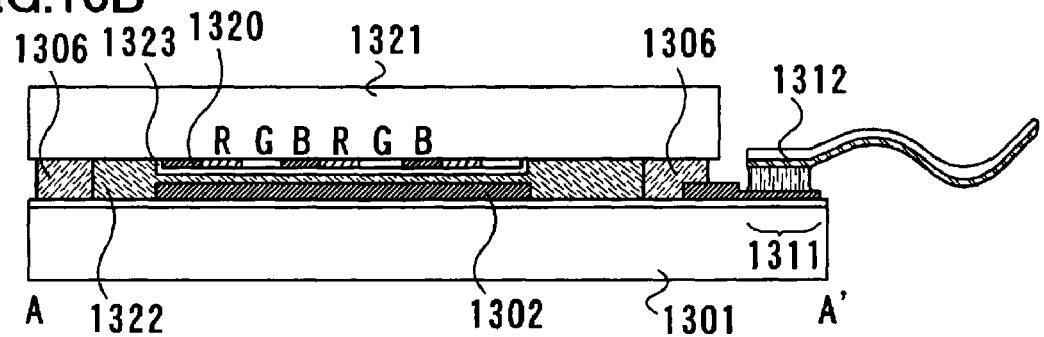
Figure 10C:
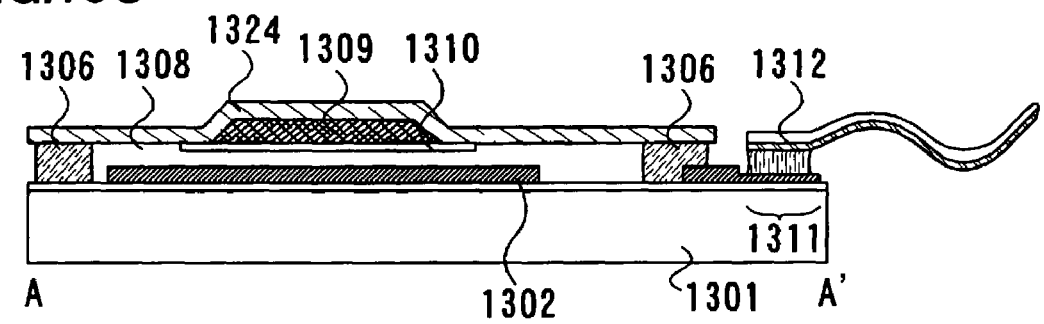

In this embodiment, description is made on a structure in which a substrate over which pixels are formed is sealed with reference to FIGS. 10A to 10C. FIG. 10A shows a top plan view of a display panel formed by sealing the substrate over which pixels are formed. FIGS. 10B and 10C are cross-sectional views along A-A' in FIG. 10A. FIGS. 10B and 10C are examples in which sealing is carried out in different ways.

In FIGS. 10A to 10C, a pixel portion 1302 including a plurality of pixels is disposed over the substrate 1301, a sealing material 1306 is provided so as to surround the pixel portion 1302, and a material for sealing 1307 is attached thereto. Structures described in the aforementioned embodiments can be used for a pixel structure.

In a display panel shown in FIG. 10B, the material for sealing 1307 in FIG. 10A corresponds to a counter substrate 1321. The light-transmissive counter substrate 1321 is attached to the substrate 1301 by using the sealing material 1306 as an adhesive layer so that an enclosed space 1322 is formed by the substrate 1301, the counter substrate 1321, and the sealing material 1306. The counter substrate 1321 is provided with a color filter 1320 and a protective film 1323 for protecting the color filter 1320. Light emitted from a light-emitting element which is arranged in the pixel portion 1302 is extracted to the outside through the color filter 1320. The enclosed space 1322 is filled with an inert resin or liquid. Note that a light-transmissive resin into which a moisture absorbing material is dispersed may be used as a resin for filling the enclosed space 1322. Further, by using the same material for the sealing material 1306 and a material for filling the enclosed space 1322, adhesion of the counter substrate 1321 and sealing of the pixel portion 1302 may be carried out at once.

In a display panel shown in FIG. 10C, the material for sealing 1307 in FIG. 10A corresponds to a material for sealing 1324. The material for sealing 1324 is attached to the substrate 1301 by using the sealing material 1306 as an adhesive layer so that an enclosed space 1308 is formed by the substrate 1301, the sealing material 1306, and the material for sealing 1324. A moisture absorbing agent 1309 is provided in a depressed portion of the material for sealing 1324 in advance so as to maintain a clean atmosphere by absorbing moisture, oxygen, and the like, which leads to prevent a light-emitting element from being deteriorated. The depressed portion is covered with a meshed cover material 1310. Although the air and moisture pass through the cover material 1310, they do not pass through the moisture absorbing agent 1309. Note that the enclosed space 1308 may be filled with nitrogen or noble gas such as argon. The enclosed space 1308 can also be filled with a resin or liquid as far as it is inert.

An input terminal portion 1311 for transmitting a signal to the pixel portion 1302 and the like is provided over the substrate 1301, and a signal such as a video signal is transmitted to the input terminal portion 1311 through an FPC (Flexible Printed Circuit) 1312. In the input terminal portion 1311, a wire formed over the substrate 1301 and a wire provided in the FPC 1312 are electrically connected to each other by using a resin in which conductive materials are dispersed (anisotropic conductive resin: ACF).

A driver circuit for inputting a signal to the pixel portion 1302 may be formed over the substrate 1301 over which the pixel portion 1302 is formed. The driver circuit for inputting a signal to the pixel portion 1302 may be formed of an IC chip and connected onto the substrate 1301 by COG (Chip On Glass). The IC chip may be disposed over the substrate 1301 by using TAB (Tape Auto Bonding) and a printed substrate.

This embodiment can be implemented by freely combining with embodiment modes, and Embodiments 1 to 5 of the invention.

EMBODIMENT 7

The invention can be applied to a display module on which a circuit for inputting a signal to a display panel is mounted.

Figure 11:
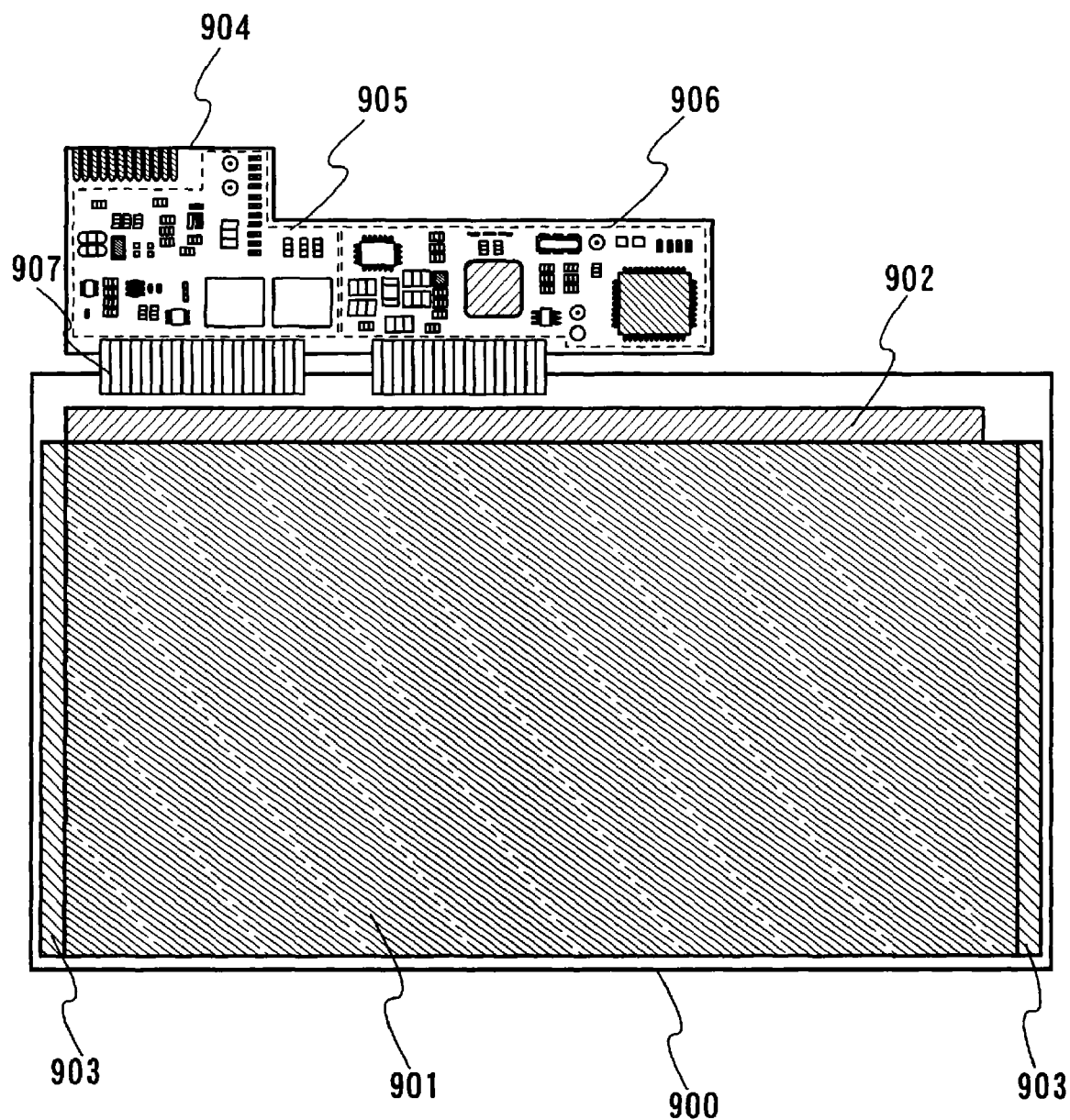
FIG. 11 is a circuit diagram showing Embodiment 7.

FIG. 11 shows a display module formed by combining a display panel 900 and a circuit substrate 904. FIG. 11 shows an example in which a controller 905, a signal dividing circuit 906, and the like are formed over the circuit substrate 904. Circuits formed over the circuit substrate 904 are not limited to them. Any circuit may be formed as far as it is a circuit which generates a signal for controlling a display panel.

A signal outputted from these circuits which are formed over the circuit substrate 904 is inputted to the display panel 900 through a connect wire 907.

The display panel 900 includes a pixel portion 901, a signal line driver circuit 902, and a scan line driver circuit 903. The display panel 900 has the same structure as that described in Embodiments 1 and 2, and the like. FIG. 11 shows an example in which the signal line driver circuit 902 and the scan line driver circuit 903 are formed over the same substrate as the pixel portion 901. However, the display module of the invention is not limited to this. Alternatively, only the scan line driver circuit 903 may be formed over the same substrate as the pixel portion 901, and the signal line driver circuit 902 may be formed over the circuit substrate 904. Both the signal line driver circuit 902 and the scan line driver circuit may be formed over the circuit substrate 904.

A display portion of various electronic appliances can be formed by incorporating such display modules.

This embodiment can be implemented by freely combining with embodiment modes and Embodiments 1 to 6 of the invention.

EMBODIMENT 8

The invention can be applied to various electronic appliances. As examples of the electronic appliances, there are a camera (a video camera, a digital camera, or the like), a projector, a head mounted display (a goggle type display), a navigation system, a car audio component stereo, a personal computer, a game machine, a portable information terminal (mobile computer, mobile phone, electronic book, or the like), an image reproducing device having a recording medium (specifically, a device for reproducing a recording medium such as a digital versatile disk (DVD), which has a display for displaying the reproduced image), and the like. FIGS. 12A to 12D show the examples of these electronic appliances.

Figure 12A:
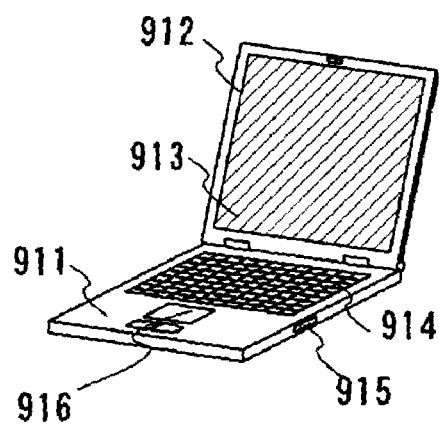
FIGS. 12A to 12D are circuit diagrams showing Embodiment 8.

FIG. 12A shows a laptop personal computer, which includes a main body 911, a housing 912, a display portion 913, a keyboard 914, an external connection port 915, a pointing mouse 916, and the like. The invention is applied to the display portion 913. By using the invention, power consumption in the display portion 913 can be reduced.

Figure 12B:
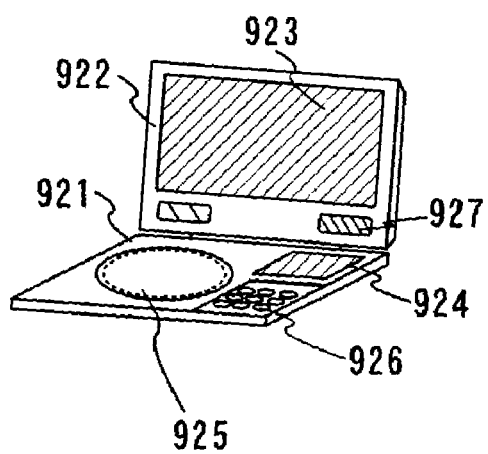

FIG. 12B shows an image reproducing device provided with a recording medium (specifically, a DVD reproducing device), which includes a main body 921, a housing 922, a first display portion 923, a second display portion 924, a recording medium (DVD or the like) reading portion 925, an operating key 926, a speaker portion 927, and the like. The first display portion 923 mainly displays image data, and the second display portion 924 mainly displays text data. The invention is applied to the first and second display portions 923 and 924. By using the invention, power consumption in the display portions 923 and 924 can be reduced.

Figure 12C:
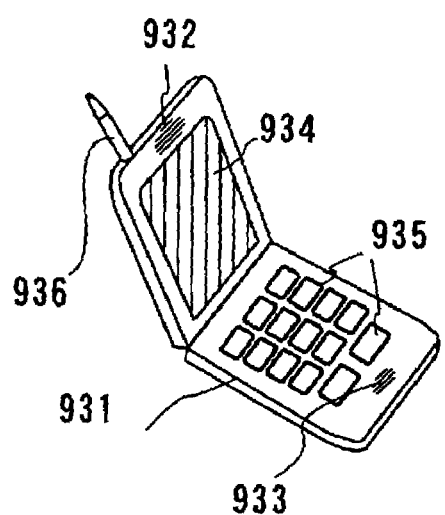

FIG. 12C shows a mobile phone, which includes a main body 931, an audio outputting portion 932, an audio inputting portion 933, a display portion 934, an operating switch 935, an antenna 936, and the like. The invention is applied to the display portion 934. By using the invention, power consumption in the display portion 934 can be reduced.

Figure 12D:
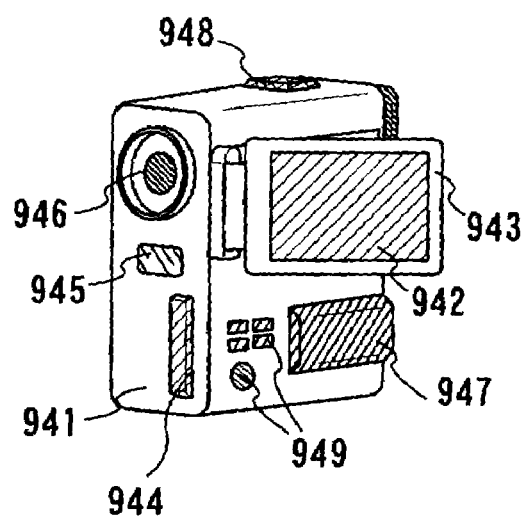

FIG. 12D shows a camera, which includes a main body 941, a display portion 942, a housing 943, an external connection port 944, a remote control receiving portion 945, an image receiving portion 946, a battery 947, an audio inputting portion 948, operating keys 949, and the like. The invention is applied to the display portion 942. By using the invention, power consumption in the display portion 942 can be reduced.

This embodiment can be implemented by freely combining with embodiment modes and Embodiments 1 to 7 of the invention.

This application is based on Japanese Patent Application serial no. 2005-121753 filed in Japan Patent Office on 19th, Apr., 2005, the entire contents of which are hereby incorporated by reference.

What is claimed is:

1. A level shifter circuit comprising
    a first power source;
    a second power source imparting a potential lower than that of the first power source;
    a first p-channel transistor;
    a second p-channel transistor;
    a third p-channel transistor;
    a fourth p-channel transistor;
    a first n-channel transistor;
    a second n-channel transistor;
    a first inputting unit for inputting a signal to a gate of the second p-channel transistor; and
    a second inputting unit for inputting a signal to a gate of the fourth p-channel transistor;
    wherein each of the first inputting unit and the second inputting unit outputs a signal which is different from that inputted to a gate of the first n-channel transistor or the second n-channel transistor,
    wherein a source and a drain of the first p-channel transistor are connected to the first power source and a source of the second p-channel transistor respectively,
    wherein a drain of the second p-channel transistor is connected to a gate of the third p-channel transistor and a drain of the first n-channel transistor,
    wherein a source of the first n-channel transistor is connected to the second power source,
    wherein a source and a drain of the third p-channel transistor are connected to the first power source and a source of the fourth p-channel transistor respectively,
    wherein a drain of the fourth p-channel transistor is connected to a gate of the first p-channel transistor and a drain of the second n-channel transistor,
    wherein a source of the second n-channel transistor is connected to the second power source,
    wherein a signal is inputted to the first inputting unit and a gate of the first n-channel transistor, and the first inputting unit outputs the signal after changing a phase and raising an amplitude voltage thereof, and wherein a signal is inputted to the second inputting unit and a gate of the second n-channel transistor, and the second inputting unit outputs the signal after changing a phase and raising an amplitude voltage thereof.

2. The level shifter circuit according to claim 1, wherein the signal outputted by the second inputting unit is inverted with respect to the signal outputted by the first inputting unit.

3. The level shifter circuit according to claim 1, further comprising an inverting unit for inverting a signal inputted to the gate of the second n-channel transistor with respect to the signal inputted to the gate of the first n-channel transistor.

4. A display module having a plurality of the level shifter circuits according to claim 1.

5. An electronic appliance having a plurality of the level shifter circuits according to claim 1.

6. A level shifter circuit comprising
a first power source;
a second power source imparting a potential lower than that of the first power source;
a third power source;
a first p-channel transistor;
a second p-channel transistor;
a third p-channel transistor;
a fourth p-channel transistor;
a first n-channel transistor,
a second n-channel transistor;
a first inputting unit for inputting a signal to a gate of the second p-channel transistor; and
a second inputting unit for inputting a signal to a gate of the fourth p-channel transistor,
wherein each of the first inputting unit and the second inputting unit outputs a signal which is different from that inputted to a gate of the first n-channel transistor or the second n-channel transistor,
wherein a source and a drain of the first p-channel transistor are connected to the first power source and a source of the second p-channel transistor respectively,
wherein a drain of the second p-channel transistor is connected to a gate of the third p-channel transistor and a drain of the first n-channel transistor,
wherein a source of the first n-channel transistor is connected to the second power source,
wherein a source and a drain of the third p-channel transistor are connected to the first power source and a source of the fourth p-channel transistor respectively,
wherein a drain of the fourth p-channel transistor is connected to a gate of the first p-channel transistor and a drain of the second n-channel transistor,
wherein a source of the second n-channel transistor is connected to the second power source,
wherein the first inputting unit includes a fifth p-channel transistor, a third n-channel transistor, and a fourth n-channel transistor,
wherein a source of the fifth p-channel transistor is connected to the first power source and a drain of the same is connected to the gate of the first n-channel transistor through the third n-channel transistor and the fourth n-channel transistor that are connected in series,
wherein a gate of the fourth n-channel transistor is connected to the third power source,
wherein a drain of the fifth p-channel transistor is an output of the first inputting unit,
wherein the second inputting unit includes a sixth p-channel transistor, a fifth n-channel transistor, and a sixth n-channel transistor,
wherein a source of the sixth p-channel transistor is connected to the first power source and a drain of the same is connected to the gate of the second n-channel transistor through the fifth n-channel transistor and the sixth n-channel transistor that are connected in series,
wherein a gate of the sixth n-channel transistor is connected to the third power source,
wherein a drain of the sixth p-channel transistor is an output of the second inputting unit, and
wherein a common control signal is inputted to gates of the fifth p-channel transistor, the third n-channel transistor, the sixth p-channel transistor, and the fifth n-channel transistor.

7. The level shifter circuit according to claim 6, wherein the control signal sets a potential provided by the first power source to a high level, and a potential provided by the second power source to a low level.

8. The level shifter circuit according to claim 6, wherein a potential provided by the third power source is higher than that provided by the second power source and lower than that provided by the first power source.

9. The level shifter circuit according to claim 6, further comprising an inverting unit for inverting a signal inputted to the gate of the second n-channel transistor with respect to the signal inputted to the gate of the first n-channel transistor.

10. A display module having a plurality of the level shifter circuits according to claim 6.

11. An electronic appliance having the level shifter circuit according to claim 6.

* * * * *